United States Patent
Ho et al.

(10) Patent No.: US 9,722,629 B2
(45) Date of Patent: Aug. 1, 2017

(54) METHOD AND APPARATUS FOR CONVERTING FROM FLOATING POINT TO INTEGER REPRESENTATION

(71) Applicants: Huong Ho, Woodlawn (CA); Michel Kafrouni, Ottawa (CA)

(72) Inventors: Huong Ho, Woodlawn (CA); Michel Kafrouni, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 262 days.

(21) Appl. No.: 14/597,917

(22) Filed: Jan. 15, 2015

(65) Prior Publication Data

US 2016/0211862 A1 Jul. 21, 2016

(51) Int. Cl.
*G06F 5/01* (2006.01)
*H03M 7/10* (2006.01)
*H03M 7/06* (2006.01)
*H03M 7/04* (2006.01)
*H03M 7/24* (2006.01)

(52) U.S. Cl.
CPC ............... *H03M 7/10* (2013.01); *H03M 7/04* (2013.01); *H03M 7/06* (2013.01); *H03M 7/24* (2013.01)

(58) Field of Classification Search
None
See application file for complete search history.

(56) References Cited

U.S. PATENT DOCUMENTS

| 5,257,215 A | 10/1993 | Poon |
| 5,303,174 A | 4/1994 | Okamoto |
| 5,508,948 A | 4/1996 | Hatta |
| 5,652,584 A | 7/1997 | Yoon |
| 5,764,548 A | 6/1998 | Keith et al. |
| 6,131,104 A * | 10/2000 | Oberman ............... G06F 7/483 708/204 |
| 6,144,977 A | 11/2000 | Giangarra et al. |
| 2004/0128331 A1* | 7/2004 | Hinds ................ G06F 9/30025 708/204 |
| 2004/0268094 A1 | 12/2004 | Abdallah et al. |
| 2011/0173421 A1 | 7/2011 | Chen et al. |

(Continued)

OTHER PUBLICATIONS 32-bit Floating-Point to Fixed-Point Converter, Rev. 1.1, Zipcores Ltd., 2011.

(Continued)

*Primary Examiner* — David H Malzahn

(57) ABSTRACT

Apparatus and methods for conversion from floating point to signed integer representation are provided. Two's complementation and determination of a shift control signal indicating the number of bit positions for shifting the two's complemented mantissa to produce the signed integer are performed in parallel. Generation of the shift control signal, including application of an optional scaling factor, is performed using an adder, with the most significant bit of input floating point exponent inverted and an external carry-in of one. Two's complementation for generation of the signed integer from the mantissa is performed using an adder. Certain aspects may be utilized for purposes other than format conversion. The two's complementation may be used for general conversion from unsigned to signed integer format or from signed to unsigned integer format.

15 Claims, 10 Drawing Sheets

(56) References Cited

U.S. PATENT DOCUMENTS

2016/0092168 A1* 3/2016 Lutz .................. H03M 7/24
                                                708/204
2016/0211862 A1* 7/2016 Ho .................... H03M 7/06
2016/0224318 A1* 8/2016 Ho .................... G06F 5/012

OTHER PUBLICATIONS

International Search Report for International Application No. PCT/CN2015/096497, mailed Feb. 29, 2016.

* cited by examiner $$SH = EXP - BIAS + SCALE$$

$$SH = EXP - (BIAS + 1) + SCALE + 1$$

METHOD AND APPARATUS FOR CONVERTING FROM FLOATING POINT TO INTEGER REPRESENTATION

FIELD OF THE INVENTION

The present invention pertains to the field of digital circuits and in particular to a method and apparatus for converting a number from its floating point representation to its signed integer representation.

BACKGROUND

Numbers can be digitally represented using a variety of binary representations, often referred to as number formats. Integer number formats include signed integers, which generally use a two's complement format for representing positive and negative numbers, and unsigned integers, which are restricted to positive values. Floating point or "real" number formats include 16-bit half precision, 32-bit single precision and 64-bit double precision formats, such as those specified in the IEEE 754 series of standards. These formats can include a sign field, an exponent field, and a mantissa or "significand" field for representing a wide range of values.

It is often required to convert a number from one format to another, in order to represent the number in an appropriate format for a particular processing task. Such conversion operations may be required in applications, for example Digital Signal Processing circuits, such as those used in wireless communication applications, as well as other general-purpose or special-purpose computing applications and integrated circuitry. Various applicable conversion circuits such as combinatorial logic circuits are known. However, prior art conversion circuits tend to exhibit performance limitations for example in terms of gate delay, logic depth, power consumption, circuit throughput, number of transistors required for implementation, and the like. In order to improve overall application performance, the performance of number format conversion circuits may require improvement.

Therefore there is a need for a method and apparatus for converting a number from its floating point representation to its signed integer representation, that is not subject to one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An object of embodiments of the present invention is to provide a method and apparatus for converting from a floating point representation to a signed integer representation. In accordance with embodiments of the present invention, there is provided an apparatus to facilitate conversion of a floating point representation to a signed integer representation. The floating point representation includes a sign, an exponent, and a mantissa. The apparatus includes a shift conditioning module, a two's complement module and a shift execution module. The shift conditioning module generates a shift control signal based at least in part on the exponent. The two's complement module operates at least partially in parallel with the shift conditioning module and is configured to generate a pre-shift output which represents the sign and the mantissa in two's complement format. The shift execution module shifts the pre-shift output by a number of bit positions specified at least in part by the shift control signal, wherein the shift execution module outputs the signed integer representation under a predefined condition.

In accordance with embodiments of the present invention, there is provided an apparatus for generating a representation, in two's complement format, of an input integer A having K bits. The apparatus includes three levels. The first level includes a first zero-stage circuit to receive a sign bit and a least significant bit $A(0)$ of the input integer. The first zero-stage circuit is configured to generate a zero-stage least-significant-bit propagate output $P_0(0)$ and a zero-stage least-significant-bit generate output $G_0(0)$ according to: $P_0(0)=A(0)$; $G_0(0)=\text{inv}(A(0))$ AND sign, where sign corresponds to a logical value of the sign bit. The first level further includes a number of further zero-stage circuits configured to receive the sign bit and a respective bit $A(i)$ of the input integer other than $A(0)$. Each further zero-stage circuit generates a zero-stage propagate output $P_0(i)$ according to: $P_0(i)=A(i)$ XOR sign. The second level includes a number of stages indexed by r, where each $r^{th}$ stage of the number of stages comprises a number of components indexed by i. Each of the number of components is configured to generate an $i^{th}$ component of an $r^{th}$ stage generate output $G_r(i)$ and an $i^{th}$ component of an $r^{th}$ stage propagate output $P_r(i)$. For i ranging from 0 to $2^{r-1}-1$, the outputs are generated according to $P_r(i)=P_{r-1}(i)$ and $G_r(i)=G_{r-1}(i)$. For i ranging from $2^{r-1}$ to $K-1$, the outputs are generated according to $P_r(i)=P_{r-1}(i)$ AND $P_{r-1}(i-2^{r-1})$ and $G_r(i)=P_{r-1}(i)$ AND $G_{r-1}(i-2^{r-1})$. The third level generates a least significant bit $OUT(0)$ of the representation equal to the least significant bit $A(0)$ of the input integer, and generates a number of further bits $OUT(i)$ of the representation according to: $OUT(i)=G_{MAX\_ROW}(i-1)$ XOR $P_0(i)$, wherein MAX_ROW equals $\log_2(K)$.

In accordance with embodiments of the present invention, there is provided a method for facilitating conversion of a floating point representation to a signed integer representation. The floating point representation includes a sign, an exponent, and a mantissa. The method includes a shift conditioning operation which generates a shift control signal based at least in part on the exponent. The method further includes a two's complement operation at least partially concurrently with the shift conditioning operation. The two's complement operation generates a pre-shift output corresponding to a representation, in two's complement format, of the sign and the mantissa. The method further includes a shift execution operation which shifts the pre-shift output by a number of bit positions specified at least in part by the shift control signal, wherein the shift execution operation generates the signed integer representation under a predefined condition.

In accordance with embodiments of the present invention, there is provided a method for generating a representation, in two's complement format, of an input integer A having K bits. The method includes three levels. The first level includes a first zero-stage operation performed on a sign bit and a least significant bit $A(0)$ of the input integer. The first zero-stage operation includes generating a zero-stage least-significant-bit propagate output $P_0(0)$ and a zero-stage least-significant-bit generate output $G_0(0)$ according to: $P_0(0)=A(0)$; $G_0(0)=\text{inv}(A(0))$ AND sign, where sign corresponds to a logical value of the sign bit. The first level further includes a number of further zero-stage operations performed on the sign bit and a bit $A(i)$ of the input integer other than $A(0)$.

Each further zero-stage operation includes generating a zero-stage propagate output $P_0(i)$ according to: $P_0(i)=A(i)$ XOR sign. The second level includes a number of stages indexed by r, where each $r^{th}$ stage of the number of stages comprises a number of component operations indexed by i. Each of the number of component operations includes generating an $i^{th}$ component of an $r^{th}$ stage generate output $G_r(i)$ and an component of an $r^{th}$ stage propagate output $P_r(i)$. For i ranging from 0 to $2^{r-1}-1$, the outputs are generated according to $P_r(i)=P_{r-1}(i)$, $G_r(i)=G_{r-1}(i)$. For i ranging from $2^{r-1}$ to K-1, the outputs are generated according to $P_r(i)=P_{r-1}(i)$ AND $P_{r-1}(i-2^{r-1})$, $G_r(i)=P_{r-1}(i)$ AND $G_{r-1}(i-2^{r-1})$. The third level includes generating a least significant bit OUT(0) of the representation, the least significant bit equal to the least significant bit A(0) of the input integer. The third level further includes generating a number of further bits OUT(i) of the representation according to: $OUT(i))=G_{MAX\_ROW}(i-1)$ XOR $P_0(i)$, where MAX_ROW equals $\log_2(K)$.

In accordance with embodiments of the present invention, there is provided a computer program product comprising a memory having recorded thereon statements and instructions for execution by a processor to carry out a method for conversion of a floating point representation to a signed integer representation, the floating point representation including a sign, an exponent, and a mantissa, the method comprising: a shift conditioning operation comprising generation of a shift control signal based at least in part on the exponent; a two's complement operation operating at least partially concurrently with the shift conditioning operation, the two's complement operation comprising generation of a pre-shift output, the pre-shift output corresponding to as representation, in two's complement format, of the sign and the mantissa; and a shift execution operation comprising shifting of the pre-shift output by a number of bit positions specified at least in part by the shift control signal; wherein the shift execution operation generates the signed integer representation under a predefined condition.

In accordance with embodiments of the present invention, there is provided a computer program product comprising a memory having recorded thereon statements and instructions for execution by a processor to carry out a method for generating a representation, in two's complement format, of an input integer A having K bits, the method comprising: a first level comprising: a first zero-stage operation performed on a sign bit and a least significant bit A(0) of the input integer, the first zero-stage operation including generating a zero-stage least-significant-bit propagate output $P_0(0)$ and a zero-stage least-significant-bit generate output $G_0(0)$ according to: $P_0(0)=A(0)$; $G_0(0)=inv(A(0))$ AND sign, wherein inv( ) corresponds to a logical inversion operation, AND corresponds to a logical AND operation, and sign corresponds to a logical value of the sign bit; and for whole number values of i indexed from 1 to K-1, inclusive, a further zero-stage operation performed on the sign bit and a bit A(i) of the input integer other than A(0), the further zero-stage operation including generating a zero-stage propagate output $P_0(i)$ according to: $P_0(i)=$XOR sign, wherein XOR corresponds to a logical XOR operation; a second level comprising a number of stages indexed by r, wherein r assumes whole number values between 1 and $\log_2(K)$ inclusive, wherein each $r^{th}$ stage of the number of stages comprises a number of component operations indexed by i, wherein i assumes whole number values between 0 and K-1 inclusive, and wherein each of the number of component operations includes generating an $i^{th}$ component of an $r^{th}$ stage generate output $G_r(i)$ and an $i^{th}$ component of an $r^{th}$ stage propagate output $P_r(i)$ according to: for i ranging from 0 to $2^{r-1}-1$, inclusive: $P_r(i)=P_{r-1}(i)$, $G_r(i)=G_{r-1}(i)$; and for i ranging from $2^{r-1}$ to K-1, inclusive: $P_r(i)=P_{r-1}(i)$ AND $P_{r-1}(i-2^{r-1})$, $G_r(i)=P_{r-1}(i)$ AND $G_{r-1}(i-2^{r-1})$; and a third level including generating a least significant bit OUT(0) of the representation, the least significant bit equal to the least significant bit A(0) of the input integer, the third level further including generating a number of further bits OUT(i), for i assuming whole number values between 1 and K-1, inclusive, of the representation according to: $OUT(i)=G_{MAX\_ROW}(i-1)$ XOR $P_0(i)$, wherein MAX_ROW equals $\log_2(K)$).

BRIEF DESCRIPTION OF THE FIGURES

Further features and advantages of the present invention will become apparent from the following detailed description, taken in combination with the appended drawings, in which.

Figure 1:
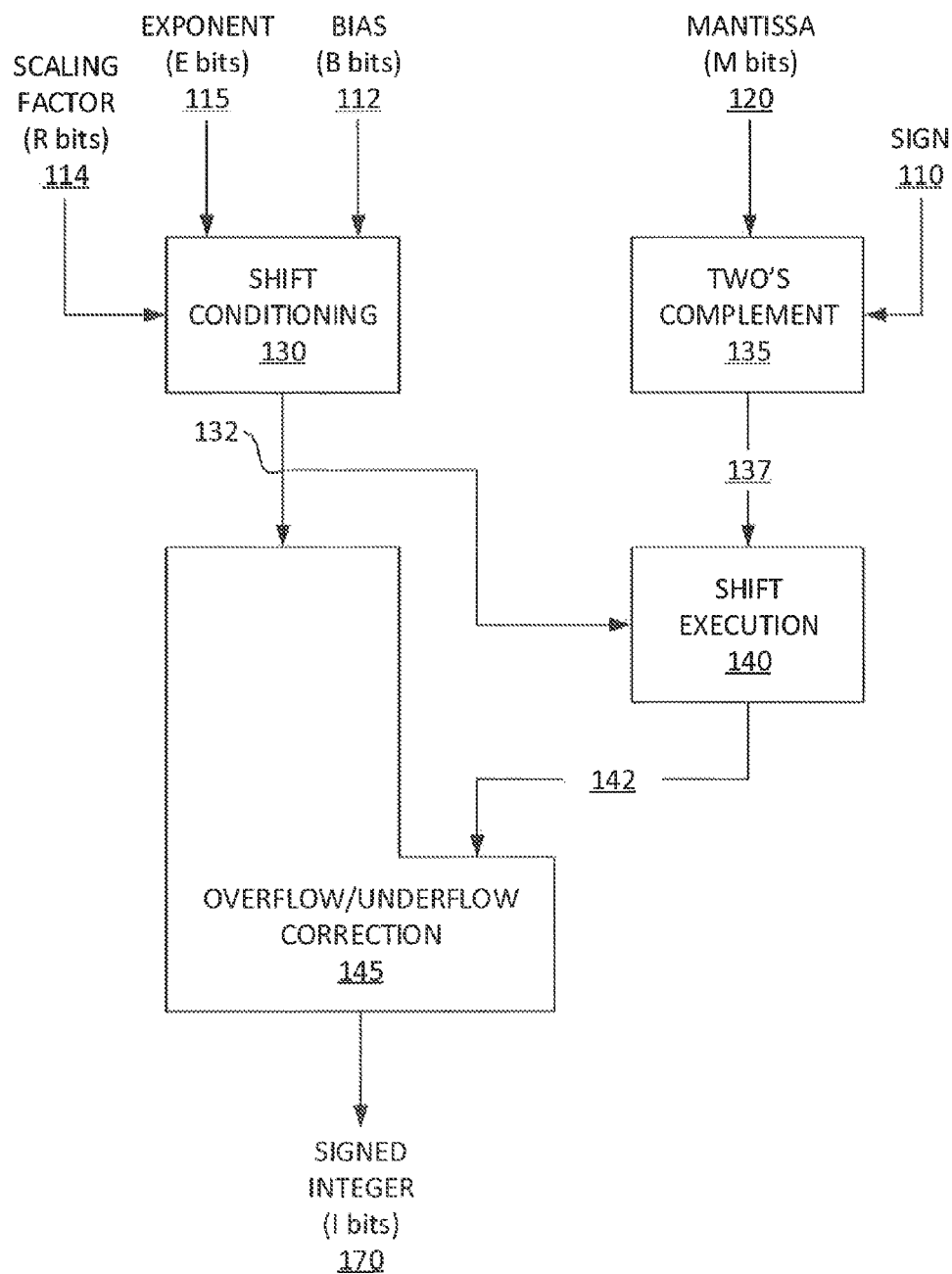
FIG. 1 illustrates method and apparatus for converting a floating point representation to a signed integer representation in accordance with some embodiments of the present invention.

It will be noted that throughout the appended drawings, like reference numerals are used to denote similar elements and features. While aspects of the present disclosure will be described in conjunction with the illustrated embodiments, it will be understood that it is not intended to limit the present disclosure to such embodiments.

DETAILED DESCRIPTION

Definitions

As used herein, the term "about" should be read as including variation from the nominal value, for example, a +/-10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this invention belongs.

Although various embodiments of the present invention are described primarily herein with respect to digital circuitry and modules thereof it will be readily appreciated that the operation of such digital circuitry and modules may correspond to aspects of a method, such as a computer-implemented method, for performing operations such as floating point to signed integer number conversion, or for performing supporting operations that may be used either in support of such number conversion or for other purposes. For example, the method may be implemented by appropriate logic circuitry of a computer such as combinatorial logic or a simulation thereof. Conversely, operations which are described in terms of operations or processes may be implemented via digital circuitry and/or modules comprising digital circuitry. Appropriate digital circuitry may include logic gates, collections of logic gates derived from standard libraries, combinatorial logic gate arrangements, and the like, implemented in an appropriate silicon or integrated circuit medium such as but not limited to integrated circuits created by Very Large Scale Integration (VLSI) processes.

Further, although embodiments of the present invention are described in the context of floating point to integer conversion and scaling, various embodiments facilitate such conversion and scaling without necessarily performing the entirety of same. For example, some embodiments may operate in conjunction with other circuitry or methods which initiate and/or complete the requisite conversion. Furthermore, some embodiments of the present invention may be applied for purposes other than floating point to integer conversion. For example, modules or component operations such as the two's complement module and shift conditioning module, or portions thereof, may be generally applicable in other areas, for example where two's complementation is desired. Further, certain embodiments of the shift conditioning module as described herein may be adapted to more generally facilitate an efficient addition of several numbers of a particular form, which may be applicable in other circumstances.

Circuit and Method Overview

Aspects of the present invention provide a method and apparatus for converting a floating point representation to a signed integer representation. Further, in various embodiments, scaling may be performed integrally with the conversion. Having reference to FIG. 1, which illustrates the conversion process in various embodiments of the present invention, the floating point representation generally includes a sign 110, an exponent 115, and a mantissa 120 (which is considered herein to have been adjusted for example to include the hidden bit, leading zero, zero padding, or the like, or a combination thereof). The mantissa may be in unsigned integer format whereas the signed integer representation 170 is in two's complement format. The conversion comprises performing a shift conditioning operation 130, performing a two's complement operation 135 concurrently and/or at least partially in parallel with the shift conditioning operation, and performing a shift execution operation 140 utilizing results of the shift conditioning and two's complement operations. The shift conditioning operation 130, the two's complement operation 135, and the shift execution operation 140 may, respectively, correspond to and/or be executed by a shift conditioning module, a two's complement module, and a shift execution module, each of which may be implemented using digital logic circuitry and may also be represented in FIG. 1 by the corresponding same reference numerals 130, 135, 140.

It is noted that the parallelization of at least the shift conditioning module 130 and the two's complement module 135 may provide for improved performance relative to certain other implementations which perform comparable operations serially. Parallelization and/or concurrent execution may be partial, for example with one operation taking a shorter amount of time than another, in which case beginning of the shorter duration operation may optionally be delayed. Furthermore, in some embodiments, operation of the shift execution module 140 commences upon partial completion of operation of the shift conditioning module 130. This provides for further parallelization and potential performance improvement. Performance improvement ma be due at least in part to increased throughput corresponding to a shortened delay path from input to output of the overall conversion process.

As will become apparent from the description herein, embodiments of the present invention exhibit regular architecture, for example in that hierarchical decomposition of the overall system results in relatively simple and similar building blocks to a substantial degree. As such, various embodiments of the present invention may be suitable for low area, low power circuit implementations such as VLSI implementations, and may be useful for accelerating computing power of various systems, such as Digital Signal Processing systems.

In more detail, the input floating point representation may be in IEEE 754 standard half precision, single-precision or double-precision format. Such formats include an $M_{fp}$-bit mantissa formatted as an unsigned integer, a sign bit denoting the sign of the number, and an E-bit exponent. The exponent may be in unsigned integer format and offset by a predetermined bias, for example in accordance with known Excess-K or offset binary representations. As such, the actual exponent, which corresponds to the indicated exponent minus the bias, may be either positive or negative. In other embodiments, the exponent may be regarded as being in two's complement format. As will be readily understood by a worker skilled in the art, a hidden bit is also typically implied in such formats, namely a leading "1" which is to be appended to the mantissa upon interpretation and/or conversion.

The value $M_{fp}$ denotes the number of bits excluding the hidden bit, whereas the value M denotes the number of hits of mantissa provided to the conversion operation. Thus, in various embodiments, the hidden bit may be included in the mantissa when provided to the two's complement operation, so that $M=M_{fp}+1$. Further, in some embodiments, a leading "0" is appended as a most significant bit adjacent to the hidden bit. This appending of a leading "0" may cast the mantissa into a two's complement format as a positive value, ready for potential negation by the two's complement operation, depending on the sign bit. Thus a desired execution of the two's complement operation is facilitated. In this case, $M=M_{fp}+2$. Further, in some embodiments, the mantissa may be padded with a predetermined number q of zeros upon provision to the conversion operation, so that $M=M_{fp}+1+q$ or $M=M_{fp}+2+q$. In various embodiments, q is selected to provide a desired value of M, for example M=I. If q is negative, then least significant bits of the mantissa may be deleted.

The output 1-bit signed integer representation may be in two's complement format, in which positive quantities are represented by their corresponding binary value, and negative quantities k are represented by the binary value corresponding to the equation $2^n-|k|$, where n is the number of bits in the signed integer representation, as would be readily understood by a worker skilled in the art. In some embodiments, the floating point representation may correspond to a pseudo-floating point number such as a binary scaled number.

It is further noted that, for IEEE 754 standard formats, E is generally less than $M_{fp}$. For example, E=5 and $M_{fp}$=11 for half-precision, E=8 and $M_{fp}$=24 for single-precision, and E=11 and $M_{fp}$=53 for double-precision format.

In accordance with embodiments of the present invention, scaling corresponds to the application of a scaling factor 114, which may be a power of 2. The scaling factor is such that the numeric value of the conversion process output corresponds to the numeric value of the conversion process input multiplied by the scaling factor. The number of bits in the scaling factor input is represented herein by the variable R. In various embodiments, scaling is integrated within the shift conditioning operation and/or module, as described below.

The shift conditioning operation 130 generates a shift control signal 132 based at least in part on the exponent 115 of the floating point representation. The shift control signal 132 is an N-bit control signal which instructs the shift execution operation 140 to shift the pre-shift output 137, as provided by the two's complement operation 135, by a certain number of bit positions. This effectively re-scales the (possibly two's complemented) mantissa by an amount which corresponds to information carried in the exponent 115 of the floating point representation, as corrected by a bias, and which may further correspond to a re-scaling corresponding to the scaling factor 114 input which may be added to the exponent. The scaling factor 114 may be represented as a signed integer in two's complement number format. The shift control signal 132 may account for a bias in the exponent, which may be a constant or which may be represented by a B-bit bias input 112. For example, the bias may correspond to the inherent exponent bias in an IEEE 754 series compliant number, such as 15 for half-precision floating point, 127 for single-precision floating point, and 1023 for double-precision floating point. The bias may be represented, if required, in unsigned binary integer format as a positive value which is to be subtracted from the exponent 115. In various embodiments, the shift conditioning operation 130 is executed using an adder circuit, such as a carry look-ahead adder, and more particularly such as a Kogge-Stone adder, as described elsewhere herein.

The two's complement operation 135 is configured to generate an output, referred to herein as the pre-shift output 137, which corresponds to a representation, in two's complement format, of the mantissa 120 of the floating point representation combined with the sign 110 of the floating point representation. As noted above, the mantissa is typically provided, at least for IEEE 754 compliant numbers, in unsigned integer format, with a separate sign bit provided to denote whether the value is positive or negative. Thus, conversion to signed integer format requires conversion of the sign and the mantissa, as taken together, to two's complement format. In various embodiments, the mantissa is considered herein to have been adjusted for example to include the hidden bit, leading zero, zero padding, or the like, or a combination thereof, either by the method or apparatus according to embodiments of the present invention or previously. In various embodiments, the two's complement operation 135 is executed using a modification of an adder circuit, such as a carry look-ahead adder, and more particularly such as a Kogge-Stone adder.

The shift execution operation 140 is configured to shift the pre-shift output 137, provided by the two's complement operation 135, by a number of bit positions corresponding to a value of the shift control signal 132, provided by the shift conditioning operation 130. This executes a re-scaling of the (possibly two's complemented) mantissa in accordance with both the exponent and the scaling factor. In various embodiments, the shift execution operation is executed using a shift circuit such as a multi-level right shifter or barrel shifter. Bit wrap-around or cyclic shift features, for example which shift the least significant bit to the most significant bit position on a right shift, may be omitted in various embodiments.

In some embodiments the output 142 of the shift execution operation 140 may be adequate as the signed integer representation output under a predetermined condition, for example a condition wherein there is neither an overflow or underflow condition. However, there is a potential for error due to an overflow condition or an underflow condition. An overflow condition may occur for example when a large positive two's complement value is bit shifted out of range to appear to be a negative value. Similarly, an underflow condition may occur for example when a large magnitude negative two's complement value is bit shifted out of range to appear to be a positive value. Other potential overflow or underflow conditions may occur, for example corresponding to conditions in which the shift control signal lies out of a predetermined range. Various embodiments of the present invention may therefore also perform an overflow/underflow correction operation, which corresponds to operation 145 in the embodiment of FIG. 1 and operations 147, 149 in the embodiment of FIG. 2, for example via operation of a corresponding overflow/underflow correction module and/or sub-modules thereof. The overflow/underflow correction operation is performed on the output 142 of the shift operation, and provides the final signed integer representation output 170.

The overflow/underflow correction operation may cause the overall output of the conversion process to saturate on overflow or underflow, by providing the signed integer representation as a predetermined saturated value. Such saturation is often preferred in digital signal processing applications since it simulates what happens to analog signals when overflow and underflow occur. Further, saturation avoids the need to test status registers and branch on overflow conditions, operations which may be incompatible with efficiently pipelined processes.

Figure 2:
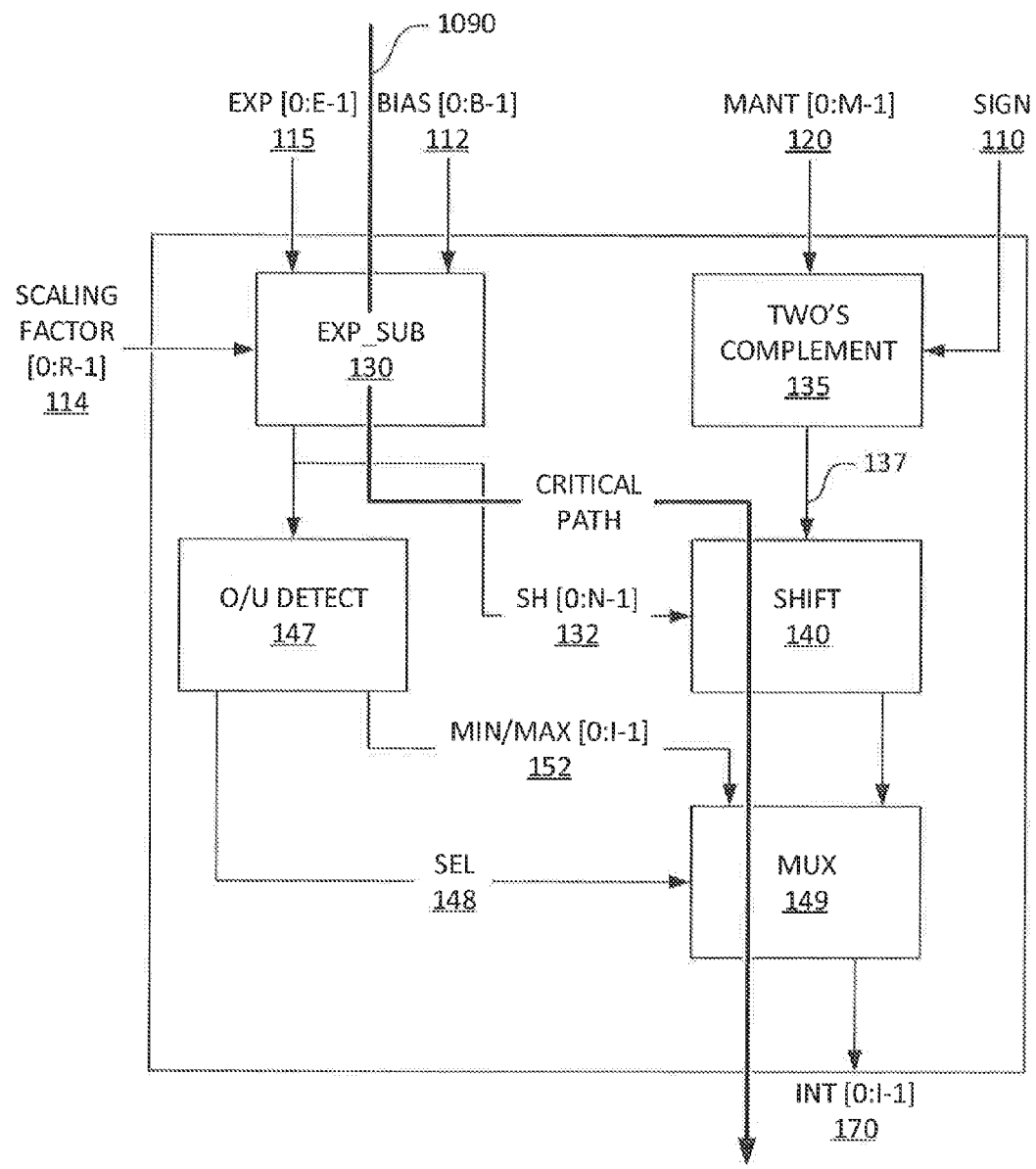
FIG. 2 also illustrates method and apparatus for converting floating point representation to a signed integer representation in accordance with some embodiments of the present invention.

FIG. 2 illustrates the conversion process as provided in various embodiments of the present invention. FIG. 2 includes components as presented in FIG. 1, presented in a different format and with the overflow/underflow correction operation or module 145 divided into sub-operations or sub-modules 147 and 149 and explained below. However, it is contemplated that the overflow/underflow correction operation may be implemented in an alternative manner. An overflow/underflow detection sub-operation or sub-module 147 detects whether an overflow or underflow condition has occurred, for example on the basis of output of the shift conditioning module 130. If an overflow or underflow condition is not detected, the overflow/underflow detection 147 controls, via a control signal 148, a multiplexer 149 to select the output 142 of the shift execution 140 as the output to pass as the final signed integer representation output 170. Otherwise, the overflow/underflow detection 147 provides an alternative output 152, which is a saturated maximum or minimum signal depending on whether overflow or underflow has been detected, respectively. The overflow/underflow detection 147 further controls the multiplexer 149 to select the alternative output 152 as the output to pass as the final signed integer representation output 170. It is noted that the overflow/underflow detection 147 can commence operation independently of the shift execution 140 and hence these two modules or operations may be at least partially performed in parallel, thereby potentially reducing delay.

Embodiments of the present invention may be applicable to digital circuit designs. In particular, an area of application of embodiments includes Digital Signal Processor (DSP) circuit designs for wireless communication applications. An advantage of some embodiments of the present invention corresponds to a relatively high throughput performance when compared with alternative designs. Another advantage of some embodiments is the relatively low logic resource usage, when compared with alternative designs, which may potentially lead to correspondingly lower power consumption.

An alternative description of some embodiments of the present invention is now provided, with reference to FIG. 2. As can be seen from the above, embodiments of the present invention provide a method and apparatus for performing the scaling of an input floating point representation (FP) by a scaling factor and conversion of the scaled result to an integer representation (INT). The exponent 115 of the FP input may be represented by an E-bit data bus. The mantissa 120, which may have been adjusted as described above, may be represented by an M-bit data bus 120. Both the exponent and the mantissa may be provided in unsigned integer (binary number) format. The scaling factor 114 is a power of two input data where its exponent is represented by R bits in two's complement format. The INT output 170 may be represented by an I-bit data bus, also in two's complement number format.

Continuing with the above-mentioned embodiments, the scaling and FP to INT conversion calculation includes three operations: shift conditioning 130, also referred to as exponent subtraction (EXP_SUB), two's complementing 135 (TC) of the mantissa if the sign 110 of the FP input is negative, and right-shifting 140 (SHIFT) of the data produced by the TC to generate the TNT output (prior to overflow correction 147, 149). The EXP_SUB operation 130 generates an N-bit shift control signal 132 used to command the shifting 140 of the data generated by the TC operation 135. The retrieving of the true exponent and the scaling of the FP input occur in this operation. The TC operation 135 performs two's complement conversion of the input mantissa depending upon the sign 110 of the FP input. If the sign of the FP input is '1' the M-bit mantissa data 120 is converted via two's complementation before being sent to the SHIFT operation 140. If the sign of the FP input is '0', the AI bit data is sent unchanged to the SHIFT operation. The SHIFT operation performs right-shifting on the data output 137 by the TC operation by N-bit positions to produce an intermediate result 142. If underflow/overflow (U/O) conditions are not detected, this intermediate result is selected by a multiplexer 149 as the INT output 170 and provided as the output of the conversion circuit. If U/O conditions are detected, the I-bit output is saturated, by action of the multiplexer 149, to the maximum value if overflow is detected or zero if underflow is detected, respectively.

Figure 3:
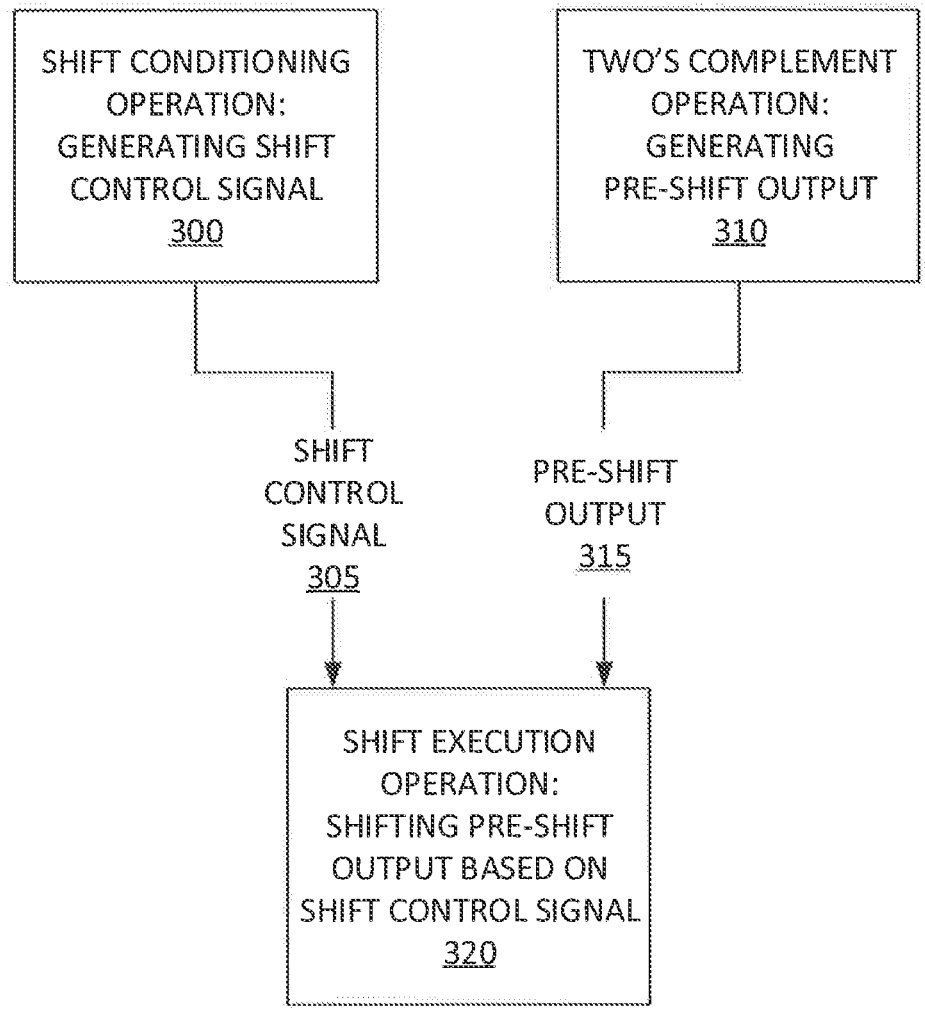
FIG. 3 illustrates a method for conversion of a floating point representation to a signed integer representation, in accordance with an embodiment of the present invention.

FIG. 3 illustrates a method for conversion of a floating point representation to a signed integer representation, in accordance with an embodiment of the present invention. The floating point representation includes a sign, an exponent, and a mantissa. The method includes a shift conditioning operation 300 which includes generating a shift control signal 305 based at least in part on the exponent. The method further includes a two's complement operation 310 performed at least partially concurrently with the shift conditioning operation. The two's complement operation 310 includes generating a pre-shift output 315 corresponding to a representation, in two's complement format, of the sign and the mantissa. The method further includes a shift execution operation 320 which includes shifting the pre-shift output by a number of bit positions specified at least in part by the shift control signal. The shift execution operation may generate the signed integer representation under a predefined condition, such as absence of overflow and underflow conditions.

Shift Conditioning Module

As mentioned above, the shift conditioning module is configured to generate a shift control signal specifying a number of bit positions by which to shift the output of the two's complement module in order to appropriately re-scale the (possibly two's complemented) mantissa, thereby providing the signed integer output or a version thereof subject to overflow/underflow correction. The shift control signal may also be used to determine whether an overflow or underflow condition is present.

In various embodiments of the present invention, the shift conditioning module implements at least one addition or subtraction operation. This may include adding the input exponent of the floating point representation to a scaling factor, subtracting an exponent bias, or both.

In some embodiments, when the format of the floating point representation input includes an implicit exponent bias, the shift conditioning module may be configured to determine a true exponent which corresponds to the input exponent minus the implicit exponent bias. As mentioned above, the bias may correspond to the inherent exponent bias in an IEEE 754 series compliant number. Such a bias may have a value equal to $2^{E-1}-1$. In some embodiments, the shift conditioning module may additionally or alternatively be configured to add a positive or negative scaling factor to the input exponent. This may be performed concurrently with determination of the true exponent.

As such, in some embodiments, the shift control signal may be configured to perform the following mathematical operation:

$$SH=EXP-\text{BIAS}+\text{SCALE}, \quad (1)$$

where SH is the value of the shift control signal, EXP is the value of the exponent of the input floating point representation, BIAS is an inherent exponent bias value (such as $2^{E-1}-1$, i.e. 15, 127 or 1023 for different IEEE 754 floating point formats), and SCALE is an input scaling factor to be applied. EXP may be E bits in length while SCALE may be R bits in length. As such, the shift control signal may be the result of subtracting the bias from the exponent to derive the true exponent, and then adding a desired scaling factor to the result of the subtraction.

In view of the above, and in various embodiments of the present invention, the shift conditioning module comprises an adder circuit. Various adder designs such as but not limited to ripple-carry adders, carry select adders, parallel prefix adders, and carry look-ahead adders such as Kogge-Stone adders, Brent-Kung adders, and the like, may be used to implement the appropriate mathematical operations set forth for example in Equation (1). However, in order to provide for a desirably low overall delay, various embodiments of the present invention comprise an adder circuit which is selected and configured to provide a valid shift control signal output prior to or at least a limited number of clock cycles after output of the two's complement circuit is valid.

In the example embodiments described herein, the two's complement module performs an addition-like operation on the M-bit mantissa, while the shift conditioning module performs an addition-like operation on the E-bit exponent. As such, regularity is exhibited. Further, since E is generally less than M for current IEEE 754 standard floating point formats, it is considered feasible to complete operation of the shift conditioning module prior to completing operation of the two's complement module. Furthermore, in various embodiments, the shift execution module may commence based on partial output of the shift conditioning module, thereby increasing feasibility of this condition. For example, at least some of the SELECT inputs of the shift execution module multiplexers may be valid prior to the multiplexer inputs being valid.

Figure 4A:
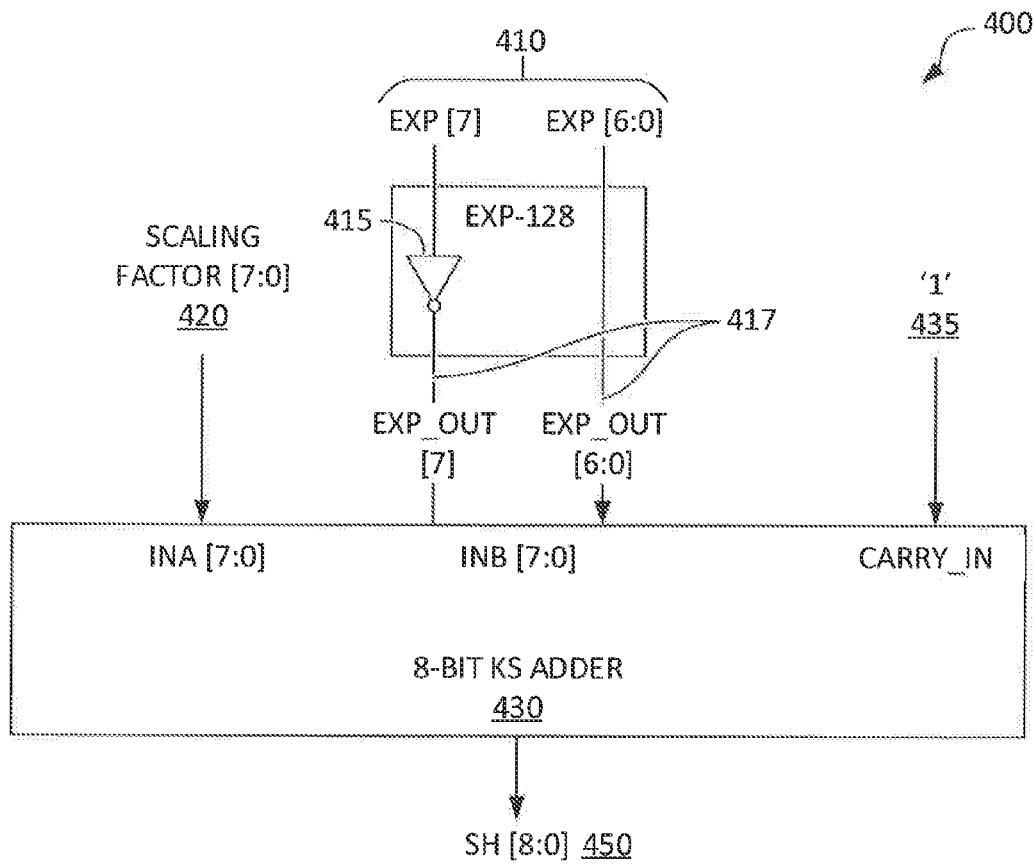
FIG. 4A illustrates a shift conditioning module provided in accordance with embodiments of the present invention.

FIG. 4A illustrates a gate level block diagram of a shift conditioning module 400 provided in accordance with an embodiment of the present invention. The illustrated circuit is configured to operate on an 8-bit exponent EXT 410 corresponding for example to an IEEE 754 single-precision floating point representation by subtracting an exponent bias of magnitude 127 (also corresponding to the IEEE 754 single-precision format), and also by applying an 8-bit scaling factor input 420. However, the general circuit design may be adapted to other sizes of inputs, other biases and/or other magnitudes of the scaling factor. The shift conditioning module 400 is configured to generate a 9-bit shift control signal (SH) 450. More generally, the shift control signal may be denoted as being N bits hi length, and N may equal E+1. It is noted that the scaling factor input 420 may also be expressed as an exponent. The scaling factor may be used to expand the range of the exponent, for example, or set to zero.

For the circuit of FIG. 4A, Equation (1) can be rewritten as:

$$SH = EXT - (BIAS+1) + SCALE + 1 \quad (2)$$

$$= (EXP - 128) + SCALE + 1. \quad (3)$$

Figure 4B:
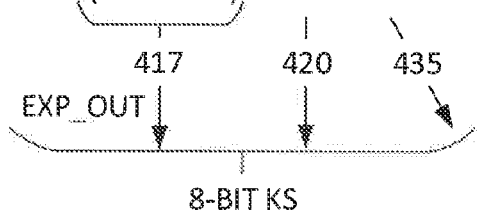
FIG. 4B illustrates operation of the shift conditioning module of FIG. 4A, in accordance with embodiments of the present invention.

Equation (3) elucidates how the shift conditioning module may be implemented, for single precision floating point, using an adder circuit 430 which sums two summand inputs, namely the modified exponent value (EXP−128) and the scaling factor input SCALE, while Equation (2) presents a more general form applicable with an arbitrary bias. The additional +1 can be incorporated using an external carry input 435 of the adder, set to logical '1'. FIG. 4B graphically illustrates derivation of Equations (1) to (3), including how the summand inputs are treated within the context of FIG. 4A.

When, as above, the exponent EXT 410 is expressed in unsigned integer format as an E-bit number, and the scaling factor SCALE is expressed in signed integer format as an R-bit number, if for example E=R then the subtraction EXP−(BIAS+1) in Equation (2) can be performed by inverting the most significant bit of the exponent EXP. Thus, for E=8, (EXP−128) may be performed by inversion of the most significant bit of EXP, denoted EXP(7). Such inversion is performed in FIG. 4A by the inverter gate 415. The modified exponent value with the most significant bit inverted may be denoted EXP_OUT 417.

FIG. 4A utilizes an 8-bit Kogge-Stone adder 430 to sum the inputs and carry in mentioned above. This design may exhibit a short critical path which potentially results in fast computation of subtraction and addition operations. The design may further exhibit low logic resource usage. Alternatively, other types of adders may be used. Furthermore, it is noted that, for the E-bit exponent, the illustrated EXP_SUB design uses one E-bit adder (such as a Kogge-Stone adder) compared to two E-bit adders which would typically be required in alternative implementations for adding more than two numbers.

As such, the above embodiment of the shift conditioning module has been designed using a Kogge-Stone (KS) adder to produce the N-bit shift control signal which is used to control the shifting of the pre-shift output provided by the two's complement module. The illustrated KS adder is configured to add the two input operands generated in accordance with the mathematical optimizations of the sum of the exponent and the scaling factor and subtraction of the bias, as described by Equations (2) and (3).

Figure 7:
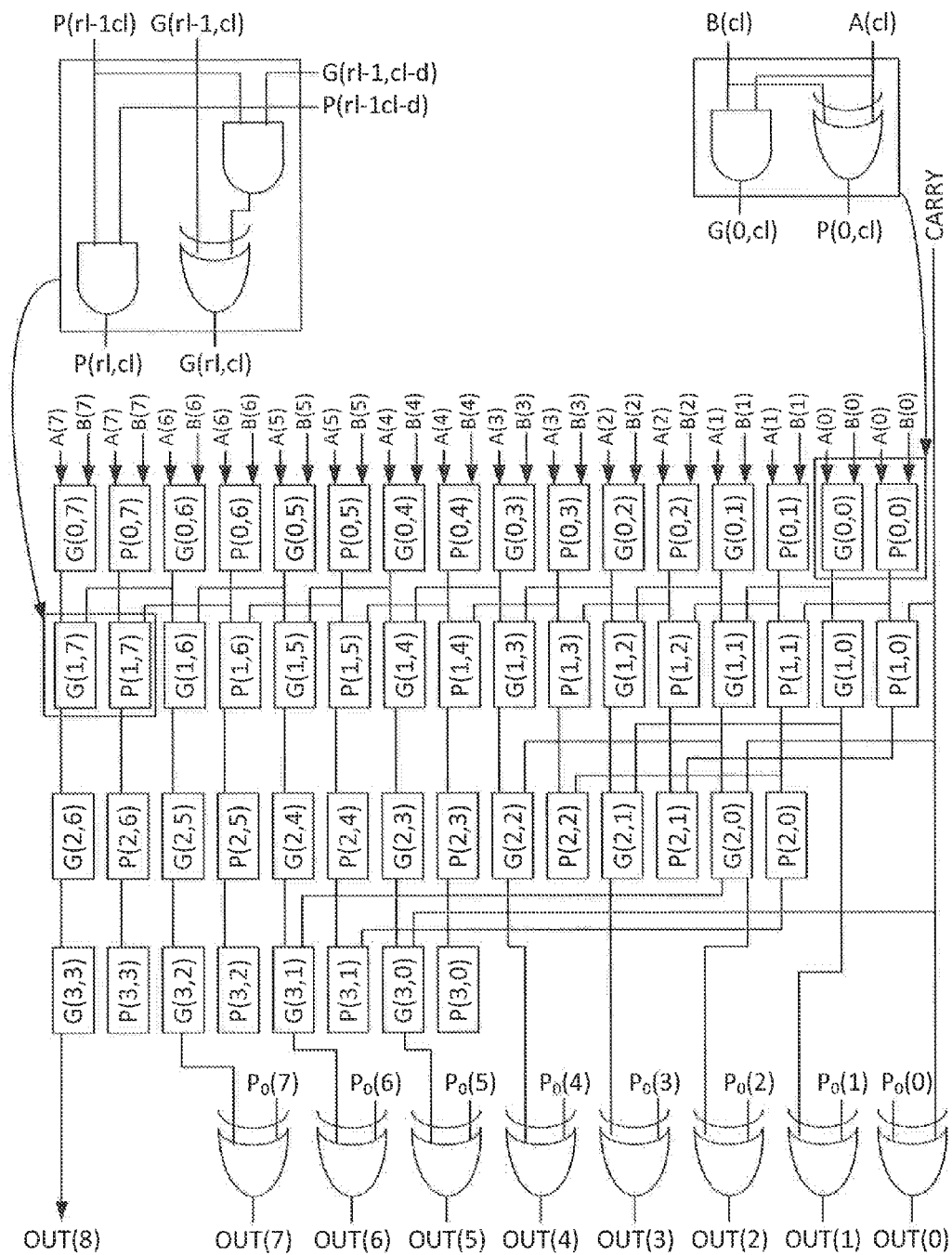
FIG. 7 illustrates a block diagram of a Kogge-Stone adder in accordance with the prior art.

It is further noted that the E-bit shift conditioning module illustrated in FIG. 4A, when implemented using Kogge-Stone adder such as is illustrated in FIG. 7, includes $\log_2(E)$ rows of Propagate (P) and Generate (G) modules, each configured to calculate the adder intermediate P and C bits. The longest delay path of the illustrated shift conditioning module is thus equivalent to $2 \log_2(E)+4$ levels of 2-input AND gate.

Two's Complement Module

As mentioned above, the two's complement module is configured to generate a pre-shift output which corresponds to a representation, in two's complement format, of the M-bit mantissa taken along with the sign of the floating point representation. The M-bit mantissa may have been prepared from the $M_{fp}$-bit portion of the floating point representation, for example by zero padding, addition of the hidden bit and a leading zero, or the like, as set forth above. If the sign indicates a positive number, then the mantissa is propagated unchanged to provide the pre-shift output, while if the sign indicates a negative number, then the mantissa is subjected to a two's complement operation and the result is provided as the pre-shift output. As used herein, the IEEE 754 format convention for the sign bit is followed, such that a sign bit of "1" indicates a negative number and a sign bit of "0" indicates a positive number. Alternative conventions may be accommodated by appropriate circuit modification.

It is noted that various conventional or non-conventional circuits are available for performing two's complement on the mantissa if the sign bit is "1" and for passing the mantissa unchanged if the sign bit is "0." For example, the mantissa may be provided to both a first input of a multiplexer and to an adder or other circuit. The adder or other circuit may be configured to perform the two's complement operation on the mantissa, by effectively performing the subtraction operation $2^n - |k|$, where n is the number of bits in the mantissa and k is value of the mantissa input. The output of the adder or other circuit is provided to a second input of the multiplexer. Finally, the sign bit is provided as the select line of the multiplexer, in order to select whether the unchanged or two's complemented version of the mantissa should be selected as output.

However, although some embodiments of the present invention may utilize various known, conventional or future-designed circuits for performing two's complementation, it may generally be desired to perform this operation in a relatively fast manner, for example with low gate delay, low logic depth, low silicon imprint, low power, or the like, or a combination thereof. As such, embodiments of the present invention provide for a particular implementation of the two's complement module which is considered to be of adequately high performance. One such implementation is described below with respect to FIG. 5.

Figure 5:
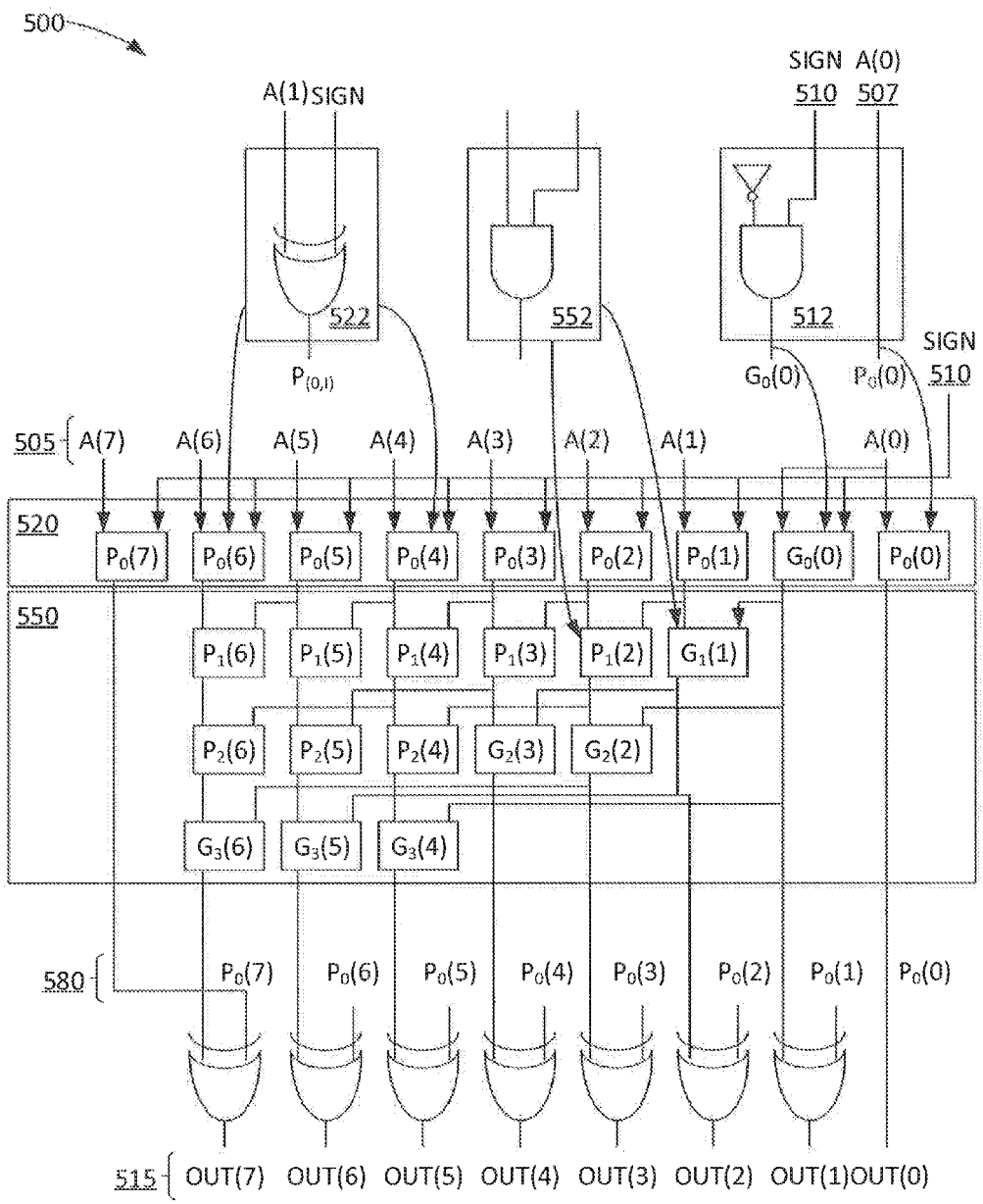
FIG. 5 illustrates a block diagram of a two's complement module provided in accordance with some embodiments of the present invention.

FIG. 5 illustrates a block diagram of a two's complement module 500 operating on 8 bits of input data, provided in accordance with some embodiments of the present invention. While 8 bits has been shown for clarity, the module may be readily adjusted to accommodate more or fewer bits of input data, such as M bits of the mantissa.

As illustrated, the two's complement module 500 receives input A 505 (which may be the mantissa) and input sign 510 (which may be the sign bit) and generates an output 515 which is equal to the input A 505 if the sign bit 510 is "0" and which is equal to a two's complement of the input A if the sign bit is "1."

The two's complement module 500 has a structure which is comparable to a Kogge-Stone adder, a version of which is illustrated in FIG. 7 for reference. The number of input bits is denoted K, which may equal M in the context of converting an M-bit unsigned mantissa corresponding to a floating point representation. Rather than a set of initial half-adders as in the Kogge-Stone adder, the two's complement module includes a first level 520 which comprises a number K−1 of XOR gates 522 operating independently and in parallel. Each XOR gate receives as input the sign bit 510 and the $i^{th}$ input bit of A 505, i.e. A(i), for i>0. The output of the $i^{th}$ XOR gate is regarded as a corresponding first stage "propagate" bit $P_0(i)$. Thus, $P_0(i)A(i)$ XOR sign. For the least significant input bit, i.e. A(0) 507, both a "generate" bit $G_0(0)$ and a "propagate" bit $P_0(0)$ are provided, namely such that $P_0(0)=A(0)$ and $G_0(0)=\text{inv}(A(0))\bullet\text{sign}$, where "sign" is the value of the binary sign bit input 510 and "●" represents logical AND. The "generate" bits $G_0(i)$, i>0 have a value of logical '0' are omitted. The least significant bit 507 may therefore be treated by the illustrated circuit 512.

The two's complement module 500 further includes a second level 550 which includes an array of generate and propagate modules. The second level 550 includes a plurality of stages. Starting with r=0, the $r^{th}$-stage generate and propagate bits $\{G_r(i) \text{ and } P_r(i): i=0 \ldots K−1\}$ are provided as inputs to a set of logical operators for generating the $r+1^{st}$ and further stages generate and propagate bits $\{G_{r+k}(i) \text{ and } P_{r+k}(i): i=0 \ldots K−1, k=1, 2 \ldots \}$. Various generate modules $G_r(\ )$, such as $G_{r-1}(i-2^{r-1})$ are equal to zero and are hence not illustrated. For example, in some embodiments, for rows r from 1 to $\log_2(K)-1$, if $c>2^r$ then $G_r(c)=0$. Further, various propagate modules $P_r(K-1)$ which would otherwise be used in generating an external carry out bit of the adder are not shown as no carry out is required in the embodiment illustrated in FIG. 5.

Further, in various embodiments, the $r^{th}$-stage (r=1, 2, ...) generate and propagate bits can be used directly to generate the $r+1^{st}$-stage generate and propagate bits, as follows. For a first portion of the $r^{th}$ stage, generate and propagate bits are passed unchanged from one stage to the next. That is, $P_r(i)=P_{r-1}(i)$, $G_r(i)=G_{r-1}(i)$ for $i=0 \ldots 2^{r-1}-1$. For a second portion of the $r^{th}$ stage, the venerate and propagate bits are provided by the evaluations: $P_r(i)=P_{r-1}(i)\bullet P_{r-1}(i-2^{r-1})$, $G_r(i)=P_{r-1}(i)\bullet G_{r-1}(i-2^{r-1})$, for $i=2^{r-1} \ldots K-1$. The count of stages r is maximized at $\log_2(K)$, for a total of r+1 stages. It is noted that this configuration is substantially different from that of a Kogge-Stone adder. Only a single multi-bit input A and a sign bit are provided, which have been manipulated in such a way that the first level 520 includes a $G_0(0)$ element and $P_0(i)$ elements. As a result, the $G_r(i)$ elements for r>0 are also zero except for particular instances such as $G_1(1)$, $G_2(2)$, $G_3(4)$, etc. as shown in FIG. 5.

It is noted that the second level 550 of the two's complement module comprises an array of generate and propagate modules with an arrangement similar to that of the Kogge-Stone adder, but with significantly fewer generate and/or propagate modules. For example, various generate and/or propagate modules may be omitted as discussed above. Further, the generate and/or propagate modules for stage r=1 and upward correspond to relatively simple AND gates 552 rather than the three-gate combination present in the Kogge-Stone adder.

A third level 580 of the two's complement module comprises a number K−1 of XOR gates in parallel, for combining the appropriate generate and propagate bits in order to effect the final output "sum." The XOR gate for the least significant bit can be omitted, for example due to the lack of an explicit external carry in bit. The output sum may be expressed in various embodiments via:

$$\text{OUT}(i)=G_{MAX\_ROW}(i) \text{XOR } P_0(i) \text{ for } i=1, \ldots K-1,$$

where MAX_ROW=log 2(K); and $$\text{OUT}(0)=P_0(0).$$

Figure 6:
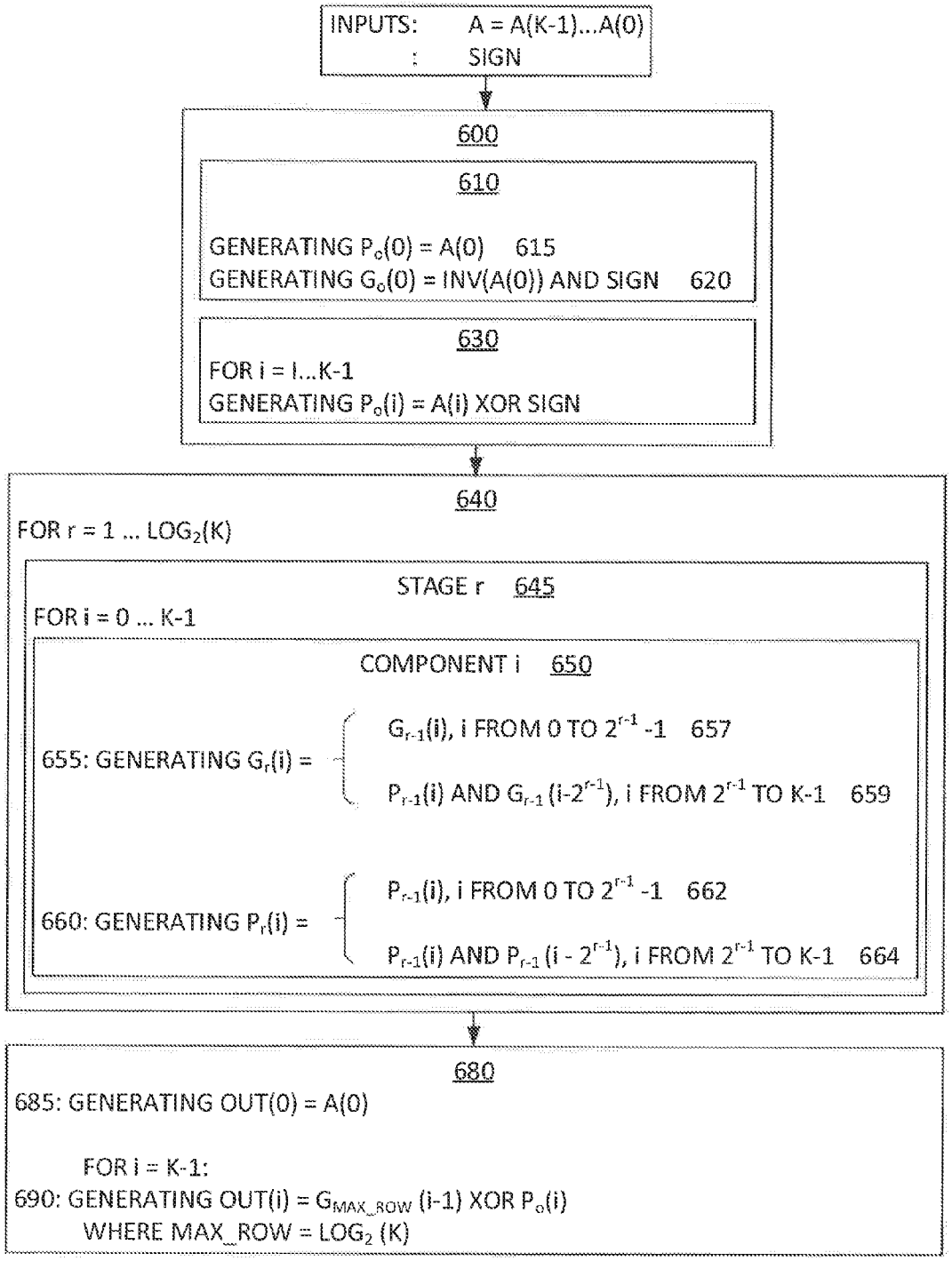
FIG. 6 illustrates a method for generating a representation, in two's complement format, of an input integer A having K bits, in accordance with an embodiment of the present invention.

FIG. 6 illustrates a method for generating a representation, in two's complement format, of an input integer A having K bits, in accordance with an embodiment of the present invention. The method includes three levels. The first level 600 includes a first zero-stage operation 610 performed on a sign bit and a least significant bit A(0) of the input integer. The first zero-stage operation includes generating 615 a zero-stage least-significant-bit propagate output $P_0(0)$ and generating 620 a zero-stage least-significant-bit generate output $G_0(0)$ according to:

$$P_0(0)=A(0); \text{ and}$$

$$G_0(0)=\text{inv}(A(0)) \text{AND sign},$$

where sign corresponds to a logical value of the sign bit. The first level further includes a number of further zero-stage operations 630 performed on the sign bit and a bit A(i) of the input integer. Each further zero-stage operation 630 includes generating a zero-stage propagate output $P_0(i)$ according to: for i indexed from 1 to K−1, inclusive:

$$P_0(i)=A(i) \text{XOR sign; and}$$

$$G_0(i)=0.$$

The second level 640 includes a number of stages 645 indexed by r, where r assumes whole number values between 1 to MAX_ROW, inclusive, where MAX_ROW equals $\log_2(K)$. Further, each $r^{th}$ stage of the number of stages comprises a number of component operations 650 indexed by i, where i assumes whole number values between 0 and K−1 inclusive. Each of the number of component operations 650 includes generating 655 an $i^{th}$ component of an $r^{th}$ stage generate output $G_r(i)$ and generating 660 an $i^{th}$ component of an $r^{th}$ stage propagate output $P_r(i)$. The outputs are generated according to:

For i ranging from 0 to $2^{r-1}-1$:

$$P_r(i)=P_{r-1}(i) 662;$$

$$G_r(i)=G_{r-1}(i) 657;$$

For i ranging from $2^{r-1}$ to K−1:

$$P_r(i)=P_{r-1}(i) \text{AND } P_{r-1}(i-2^{r-1}) 664; \text{ and}$$

$$G_r(i)=P_{r-1}(i) \text{AND } G_{r-1}(i-2^{r-1}) 659.$$

The third level 680 includes generating 685 a least significant bit OUT(0) of the representation according to:

$$OUT(0) = P_0(0) = A(0).$$

The third level further includes generating 690 a number of further bits OUT(i), for i indexed from 1 to K−1, of the representation according to:

$$OUT(i) = G_{MAX\_ROW}(i-1) \text{ XOR } P_0(i).$$

It is further noted that an M-bit two's complement module corresponding to the illustration in FIG. 5 above requires an overall delay of log 2(M)+4 levels of 2-input AND gate. For M=8, the delay is therefore about 7 levels, noting that each XOR gate is equivalent to two levels of two-input AND gate.

Generalized Applicability of the Two's Complement Module

As set forth above, the two's complement module may be integrated into an apparatus for facilitating conversion of an unsigned integer, namely corresponding to the mantissa of a floating point representation, to a signed integer representation in two's complement format. However, it will readily be appreciated that the two's complement module may be used more generally to facilitate conversion of an unsigned integer to a signed integer, two's complement format. More specifically, when a separate sign bit indicates that the unsigned integer should be represented as a negative number of equal magnitude, the two's complement module outputs the appropriate negative number in two's complement format. When the sign bit indicates that the unsigned integer should be represented as a positive number of equal magnitude, the two's complement module outputs the appropriate positive number in two's complement format, which generally matches the unsigned integer.

It is further recognized herein that the two's complement module may be used in conversion of a signed integer (already in two's complement format) to an unsigned integer, or to compute the absolute value of a signed integer. In this case, the sign bit may be carried within the signed integer as the most significant bit. If the signed integer is already positive, the two's complement module again provides an output equal to the input. If the signed integer is negative, the two's complement module provides an output equal to the two's complement of the input, thereby providing an output which is positive and equal in magnitude to the input signed integer. The sign bit may be output separately if desired.

Conversion between signed integers and unsigned integers, as well as absolute value computations, as set forth herein, may be used in various applications such as digital signal processing, math co-processing, and the like, and applied to various applications including but not limited to data communication and mobile computing.

Shift Execution Module

As mentioned above, the shift execution module is configured to shift the pre-shift output of the two's complement module by a number of bit positions specified in at least a portion of the shift control signal as provided by the shift conditioning module, which results in the generation of the signed integer representation under a predefined condition, namely absence of both an overflow condition and an underflow condition. The shifting executes the appropriate re-scaling of the (possibly two's complemented) mantissa. The re-sealing is defined at least in part by the exponent, and possibly further defined by correcting the exponent due to a bias and modifying the exponent by an input scaling factor. In various embodiments, the shift execution operation may be carried out by a Barrel Shifter or similar circuit, as would be readily understood by a worker skilled in the art.

For example, in some embodiments, if the shift control signal, or a portion thereof, corresponds to a value n, then the shift execution module operates to shift the pre-shift output by n bit positions. In some embodiments, n may be positive or negative. In other embodiments, n may be restricted to positive values. In some embodiments, n may be restricted to negative values. In some embodiments, positive values of n correspond to left shift operations of the shift execution operation, while negative values of n correspond to right shift operations.

As another example, in some embodiments, the shift control signal or portion thereof may specify a number P of positions that a fractional point or radix point is to be shifted. In contrast the shift execution module may be configured to shift the bits of the pre-shift output rather than shifting of the fractional point or radix point itself. A solution in various embodiments is to obtain a binary value Q corresponding to the bit-wise inversion of the binary representation of P and shift the bits of the pre-shift output by Q positions. In one embodiment, a bank of inverters are coupled to the shift control signal lines so that the shift execution module is provided with the bit-wise inverted shift control signal. In another embodiment, the inversion may be incorporated into the circuit, for example by swapping the connections of the "1" and "0" inputs for each multiplexer used to implement a shift execution module corresponding for example to the circuit of FIG. 8.

In some embodiments, the shift execution module may utilize only a portion of the shift control signal. For example, when non-cyclic shifting is utilized, shifts of the pre-shift output beyond a maximum number of bit positions may cause all bits of the pre-shift output to be discarded by the shift execution module, that is, replaced by other values unrelated to the pre-shift output. As such, portions of the shift control signal that would indicate a bit shift magnitude beyond the maximum number of bit positions may be disregarded. Further, an overflow or underflow condition may be detected when the shift control signal indicates a bit shift magnitude beyond the maximum number of bit positions. As an example, if the signed integer representation is I bits, then as a first approximation shifts of greater than I bit positions may be expected to result in such an overflow or underflow condition.

Figure 8:
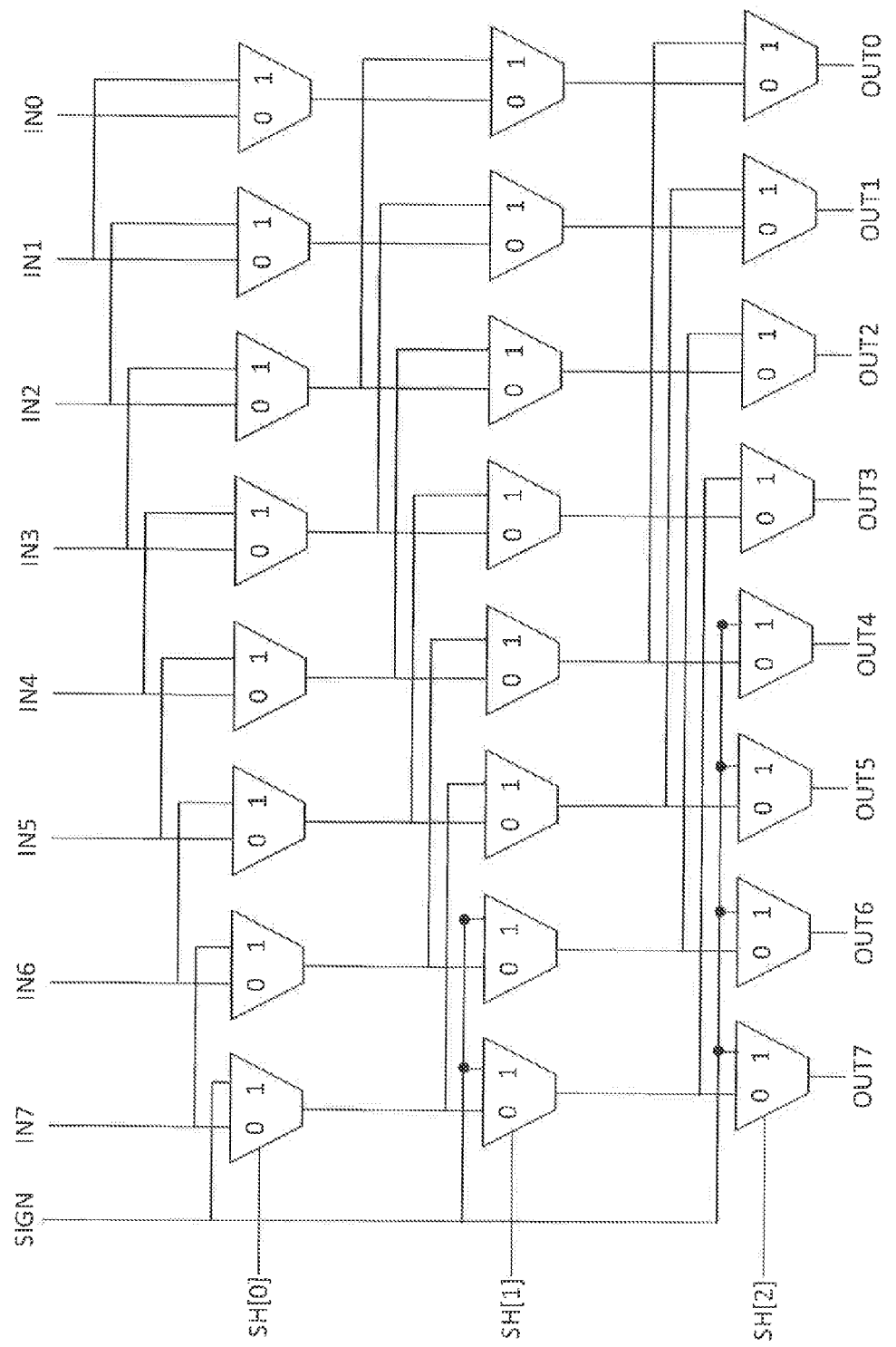
FIG. 8 illustrates a 3-level right-shifter of a shift execution module provided in accordance with embodiments of the present invention.

FIG. 8 illustrates a block diagrams of a 3-level Barrel Shifter provided as the shift execution module, in accordance with an embodiment of the present invention. The barrel shifter receives, as input to a top level array of multiplexers, the M-bit pre-shift output. The barrel shifter further receives, as SELECT signals to the array of multiplexers, at least a portion of the shift control signal. Some aspects of the illustrated barrel shifter are standard and would be readily understood by a worker skilled in the art. As illustrated, only the three least significant bits are required for control of the shift execution module in embodiments where an 8-bit signed integer representation is output (noting that $\log_2(8) = 3$).

As illustrated in FIG. 8, the barrel shifter performs right-shifting of the pre-shift output, by a number of bit positions based on the input provided by the shift control signal, as would be readily understood by a worker skilled in the art. As also illustrated, when the pre-shift output is shifted by n bit positions, the n most significant bits are replaced with a bit equal to the sign bit 110. This may be appropriate for example due to the data now being expressed in two's complement format. If the pre-shift output is positive, right-shifting and replacing the most significant bits with 'zero' bits preserves positivity. If the pre-shift output is negative, right-shifting and replacing the most significant bits with 'one' bits preserves negativity in the two's complement format.

In various embodiments, right shifting is executed due to incorporation of the "hidden bit" in the mantissa, as would be readily understood by a worker skilled in the art.

The 3-level shifter illustrated above may be sufficient for implementing the shifting for an 8-bit signed integer representation output. More generally, a $\log_2(I)$ level shifter may be used for shifting for an I-bit signed integer representation output. For example, using a $\log_2(I)$ level shifter allows for I different right-shift values which covers the range of applicable shifts prior to overflow/underflow. Furthermore, in various embodiments, I may be configured as being equal to the number of bits $E+M_{fp}$ in the input floating point representation. For example, where the floating-point representation is an IEEE 754 half-precision, single-precision, or double-precision floating point representation, the signed integer representation may be a 16-bit, 32-bit or 64-bit representation, respectively.

In some embodiments of the present invention, operation of the shift execution module begins substantially immediately after the Least Significant Bit (LSB) of the shift control signal is valid. Thus, the shift execution module may begin operation as soon as the first output bit of the shift conditioning module is available and valid. In the embodiment of FIG. 4A, Out(0) is actually equal to A(0) so there may be zero gate delay on the LSB. The next least significant bit Out(1) is valid after a delay of three levels of 2-input AND gate (noting that XOR has a gate delay of two levels of 2-input AND gate).

As another example, for a shift conditioning module similar to that of FIG. 4A, incorporating a Kogge-Stone adder circuit, the LSB of the shift control signal may be considered valid after a delay corresponding to approximately four levels of 2-input AND gate from commencement of the number conversion operation. This may be the case when the LSB of a KS adder is generated by two 2-input XOR gates. In this case, the latency of the shift conditioning module may be considered as equivalent to four levels of 2-input AND gate.

It is further noted that operation of the shift execution module as illustrated in FIG. 8 above requires a delay of 2 $\log_2(M)$ levels of 2-input AND gate. This may correspond to the amount of time taken to propagate the M-bit pre-shift output through $\log_2(M)$ levels of multiplexer, each level of multiplexer comprising two levels of AND gate. In various embodiments, one or more bits of the shift control signal, starting with the least significant bits, are valid prior to the pre-shift output being valid. Thus, the SELECT inputs of the various multiplexers may be set to their appropriate values prior to the pre-shift output being valid. As such, the delay introduced by the shift execution module may be substantially equal to the delay for propagating the pre-shift output, with substantially no additional delay due to providing, receiving and/or processing of the shift control signal, for example since such additional delay is masked by other operations.

Overflow/Underflow Correction Module

As mentioned above, the overflow/underflow correction module, which may be included or excluded in different embodiments of the present invention, or alternatively which may be bypassable, is configured to causes the overall output of the conversion process to saturate on detection of an overflow condition or an underflow condition. In various embodiments, the overflow/underflow correction module includes an overflow/underflow detection sub-module and a multiplexer which operate as described elsewhere herein.

In various embodiments, the overflow/underflow correction module is operative to cause the final signed integer representation output to saturate to a maximum value if overflow has been detected and to a minimum value if underflow has been detected. In some embodiments, the minimum value is equal to zero. In other embodiments, the minimum value may be equal to a highest-expressible magnitude negative value.

It is further noted that operation of the multiplexer portion of the Overflow/Underflow Correction module as illustrated in FIG. 2 above requires a delay of about 2 levels of 2-input AND gate. This corresponds to a standard multiplexer implementation and corresponds to the delay in propagating the multiplexer input to the multiplexer output. Furthermore, as operation of the Overflow/Underflow Detection sub-module may, in some embodiments, be performed concurrently with operations of the shift execution module and partially concurrently with operations of the two's complement module, the propagation delay of the Overflow/Underflow Detection sub-module may be masked by the delays of these other operations. As such, the SELECT input and the alternative value input 152 provided to the multiplexer portion of the Overflow/Underflow Correction module may be valid prior to the intermediate output of the shift execution module being valid. Therefore, the additional delay introduced by the Overflow/Underflow Correction module may indeed be equal to about 2 levels of 2-input AND gate.

In various embodiments, the overflow/underflow condition may be determined as follows. If the shift control signal is negative, then underflow may be deemed to have occurred, whereas if the shift control signal is greater than I, where I is the number of bits in the signed integer representation, then overflow may be deemed to have occurred. Such conditions may be detected by applying appropriate logical operations to bits of the shift control signal, as would be readily understood by a worker skilled in the art.

Comparison with Alternative Implementation

A performance comparison between a particular embodiment of the present invention and a particular alternative implementation of floating point to integer conversion will now be provided. It should be understood that this performance comparison is not necessarily limiting to the present invention, but rather descriptive of certain embodiments. For example, if embodiments of the present invention are modified for example by implementing alternative adders, or by modifying the parallelization of various operations, then the performance values below may be modified.

Alternative Conversion Circuitry

Figure 9:
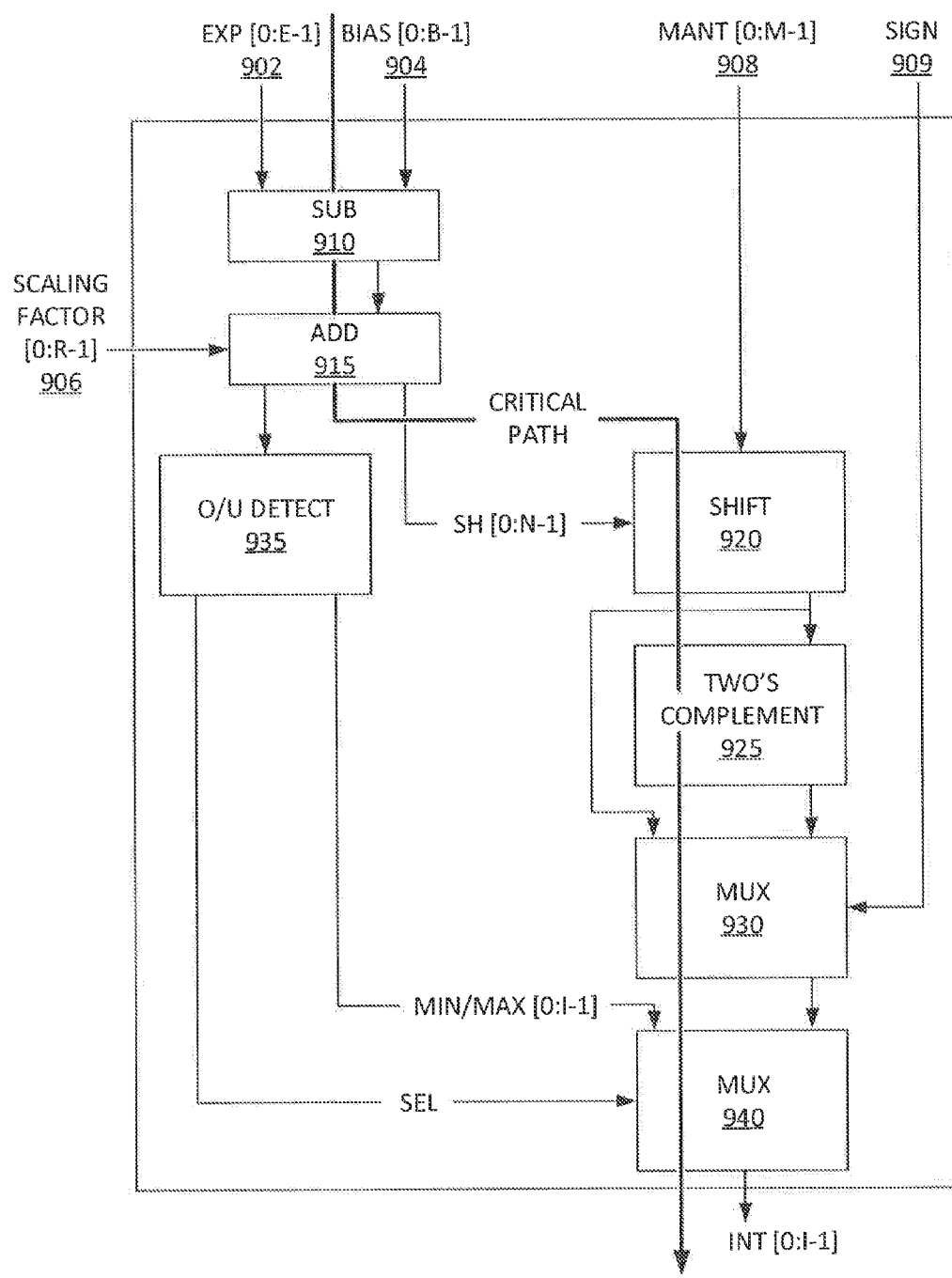
FIG. 9 illustrates a top level block diagram of an apparatus for performing scaling of an input signed integer representation by a scaling factor and conversion to a floating point representation, in accordance with an alternative circuit which is provided as a basis for comparison.

FIG. 9 illustrates a top level block diagram of an apparatus for performing scaling of an input floating point representation by a scaling factor and conversion to a signed integer representation, in accordance with an alternative circuit which is provided solely as a basis for comparison. Although embodiments of the present invention are purported to have advantages over the alternative circuitry, the present discussion should not be taken as an admission that the alternative circuitry is necessarily considered to be prior art.

For the illustrated alternative circuitry, the process of floating point scaling and floating point to integer conversion involves the subtraction 910 of the E-bit exponent 902 of the floating point representation to a B-bit bias 904, the intermediate result is then added 915 to an R-bit exponent of an input scaling factor 906. This is followed by the shifting 920, such as right shifting, of the mantissa 908. Subsequently the shifted data is two's complemented 925 to produce an I-bit integer output result. The two's complemented or non-two's complemented data is selected based on the sign input 909 by operation of a multiplexer 930. Overflow/underflow detection 935 is performed and correction is applied by operation a multiplexer 940, for example by saturating the output upon overflow or underflow.

For the above alternative circuitry, the exponent retrieval and the scaling operations using E-bit and R-bit Kogge-Stone adder, respectively, may have a gate delay of at least 2 $\log_2(E)+2 \log_2(R)+8$ levels of 2-input AND gate. The shifter used in the SHIFT operation 920 and an M-bit KS adder required by the TC operation 925 would have a delay of 2 $\log_2(M)$ and 2 $\log_2(M)+4$ levels of 2-input AND gate, respectively. As a result, the overall propagation delay required for the INT data to be valid at the output of the circuit is approximately 2 $\log_2(E)+2 \log_2(R)+4 \log_2(M)+16$ levels of 2-input AND gate. As such, a single precision FP data represented in IEEE 754 format, scaled by a 8-bit scaling factor, and the result converted to a 32-bit integer, would have a total gate delays of about 48 levels of 2-input AND gate if the alternative circuitry is used.

Timing Diagram and Critical Path

Figure 10:
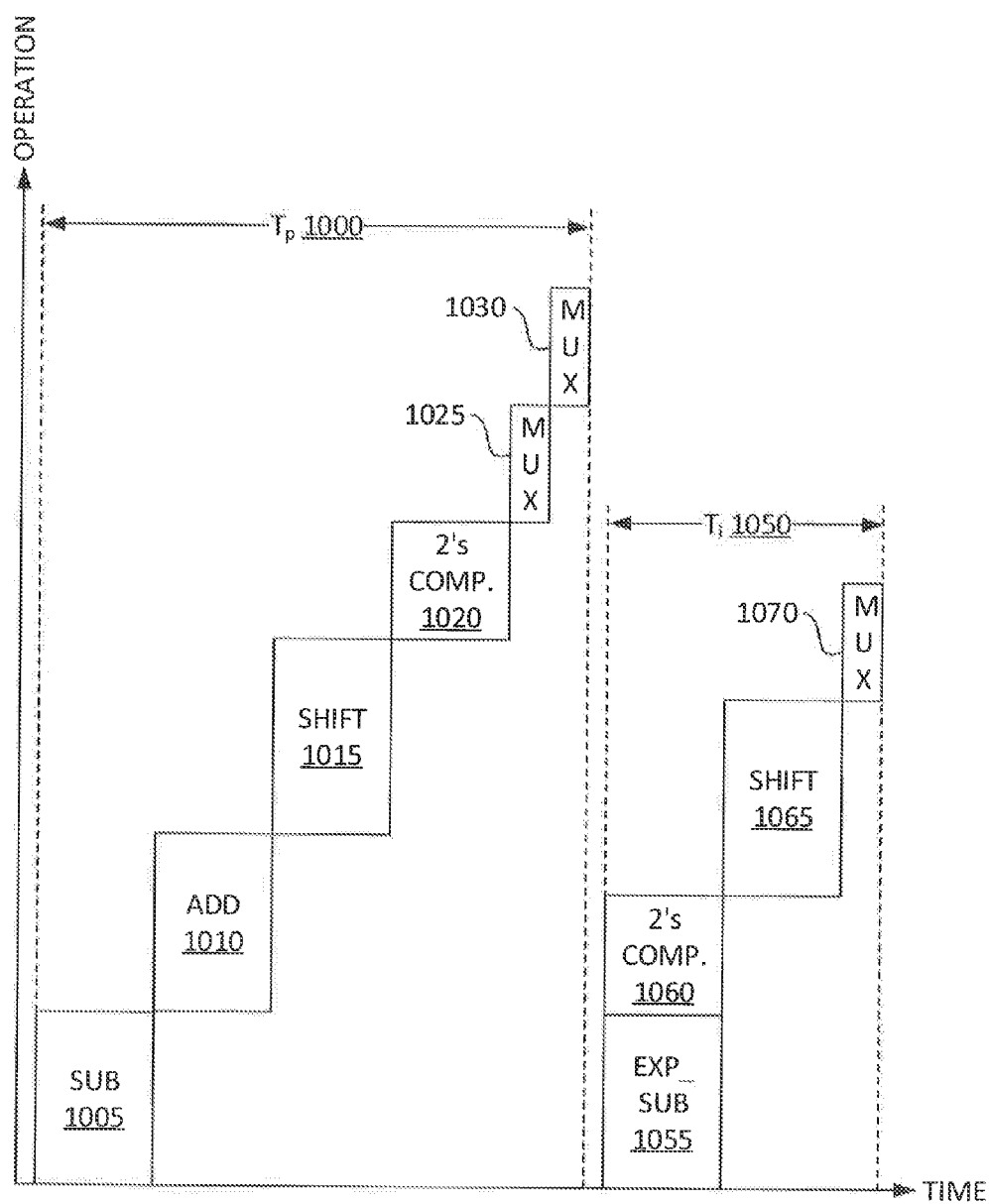
FIG. 10 illustrates timing performance comparisons between a particular embodiment of the present invention and the alternative circuitry as illustrated in FIG. 9.

FIG. 10 depicts timing performances comparisons between a particular embodiment of the present invention and the alternative circuitry as described above. The abbreviations Tp 1000 and Ti 1050 represent the total timing delay of the alternative circuitry and of the particular embodiment of the invention, respectively. As shown on the diagram, the gate delay of alternative circuitry designs Tp is equal to the sum of the delays of the SUB 1005, ADD 1010, SHIFT 1015, Two's Complement (TC) 1020, and MUX 1025, 1030 operations. For the Ti, the delay is shorter due to the parallel processing of the EXP_SUB, the TC, and the SHIFT operations.

The particular embodiment of the present invention corresponds to that of FIGS. 1 and 2, wherein the shift conditioning module of FIG. 4A and the two's complement module of FIG. 5 are employed.

As illustrated, the delay Ti for the particular embodiment of the present invention is defined in part by the parallel operations of EXP_SUB 1055, which corresponds to operation of the shift conditioning module 130 and TC 1060, which corresponds to operation of the two's complement module 135, SHIFT 1065, which corresponds to operation of the shift execution module 140, may also operate partially in parallel with EXP_SUB 1055 and/or TC 1060 in some embodiments. The MUX 1070 operation occurs subsequently and corresponds to operation of a multiplexer portion 149 of the overflow/underflow correction module illustrated in FIG. 2. It is further noted that, in some embodiments, operation of the overflow/underflow detection sub-module of the overflow/underflow correction module may be performed at least partially in parallel with operation of the shift execution module and/or the two's complement module. The overall delay can be significantly shorter than the delay of the alternative circuitry.

In various embodiments, where M>E, the two's complement operation may be slower than the shift conditioning operation. As such, the SELECT inputs of the shift execution module may be set before the pre-shift output is valid. As such, the delay contribution of the shift execution module may be equal to the propagation delay from the first multiplexer input to the last multiplexer output, which may be about two levels of 2-input AND gate multiplied by the number of levels of multiplexer.

In the present embodiment, since the shift conditioning and two's complement operations operate in parallel, and the shift execution operation can start substantially immediately after the LSB of the shift conditioning operation is valid which takes 4 levels of gate delays, the path that goes through the TC block to the SHIFT block and out of the MUX may be considered to be the critical path of the conversion circuitry. The critical path 1090 is illustrated in FIG. 2.

In the present embodiment, the shift conditioning module and two's complement module are designed based on the Kogge-Stone parallel prefix adder architecture. The adder of the shift conditioning operation includes $\log_2(E)$ rows of Propagate (P) and Generate (G) modules for calculation of the adder intermediate P and G bits. The longest delay path of the shift conditioning operation circuit is thus equivalent to 2 $\log_2(E)+4$ levels of 2-input AND gate. For the two's complement operation being performed on M bit input data, an overall delay of $\log_2(M)+4$ levels of 2-input AND gate may be required. The shift execution operation is considered to have a delay of 2 $\log_2(M)$ levels of 2-input AND gate. The delay contribution of the multiplexer 149 of the overflow/underflow correction module is 2 levels of 2-input AND gate. The total gate delays of the present embodiment is therefore equal to 3 log 2(M-bit)+6.

Various embodiments of the present invention provide for a method, apparatus and/or circuit that performs the scaling of a floating point representation and conversion to a signed integer representation. The main building blocks of various embodiments may be designed for fast throughput performance and low logic resource usage. Embodiments of the present invention may be characterized by small logic depths that enable fast propagation of signals from input of the circuit to output of the circuit. In one embodiment, the longest and hence overall propagation delay path of the conversion circuit is equivalent to 3 $\log_2(M)+6$ levels of 2-input AND gate, where M is the bus size of the mantissa. Furthermore, various embodiments of the present invention may be extended to support scaling and conversion of floating point data of a variety of input/output lengths including but not necessarily limited to IEEE 754 floating point standard input data of half, single and double precision and 16, 32, and 64 bit integer outputs.

Thus, for example, based on the circuit architecture proposed in embodiments of the present invention, a floating point data representation in IEEE 754 single precision format, scaled by an 8-bit scaling factor and converted to a 32-bit integer may be converted with a total delay of about 21 levels of 2-input AND gate.

Further, in embodiments of the present invention, the two's complement module, the shift conditioning module, or both, may utilize advantageous designs for fast throughput performance and efficient use of logic resources. To two's complement an M-bit input mantissa, an embodiment of the two's complement module requires an overall delay of log 2(M)+4 levels of 2-input AND gate. For an E-bit exponent, an embodiment of the shift conditioning, module uses one E-bit Kogge-Stone adder rather than two E-bit KS adders as in the alternative circuitry presented herein. Also in embodiments of the present invention, the shift execution module may be configured to begin operation substantially immediately after the least significant bit (LSB) of the output of the shift conditioning module is valid, thereby potentially requiring a delay of approximately four levels of 2-input AND gate. With the shift conditioning module, the two's complement module, and the shift execution module operating at least partially in parallel, the propagation delay caused by the additions in the shift conditioning module may be masked. The total propagation delay of embodiments of the overall circuit method and apparatus may then be determined by the delay of the shift execution module and the MUX operations plus $\log_2(M)+4$ units corresponding to the delay of the two's complement module. With the two's complement module operated at high throughput performance and with the propagation delay of the shift conditioning module almost removed from the total delay of the overall circuit, fast computation of floating point scaling and conversion to integer format may be achieved in various embodiments. Through the descriptions of the preceding embodiments, the present invention may be implemented by using hardware only or by using software and a necessary universal hardware platform. Based on such understandings, the technical solution of the present invention may be embodied in the form of a software product. The software product may be stored in a non-volatile or non-transitory storage medium, which can be a compact disk read-only memory (CD-ROM), USB flash disk, or a removable hard disk. The software product includes a number of instructions that enable a computer device (personal computer, server, or network device) to execute the methods provided in the embodiments of the present invention. For example, such an execution may correspond to a simulation of the logical operations as described herein. The software product may additionally or alternatively include number of instructions that enable a computer device to execute operations for configuring or programming a digital logic apparatus in accordance with embodiments of the present invention.

The following example corresponds to operation of an embodiment of the present invention. A floating point representation in single precision IEEE 764 Floating Point number format is provided having a sign bit, exponent and mantissa, represented by:

1 10010111 01101100001001000000000.

The sign "1" indicates the number is negative. The exponent 10010111 corresponds to a decimal value of 151, and the mantissa, when a leading zero, the hidden bit and seven trailing zeros are added, correspond to a 32-bit mantissa value of:

01011011000010010000000000000000.

A scaling factor of 2 is also provided. The shift conditioning operation corresponds to subtraction of the bias of 127 from the exponent value and addition of the scaling factor to obtain the shift control signal SH, according to:

SH=Exponent−bias+scale
=151−127+2
=26.

Concurrently, the above 32-bit mantissa value is two's complemented to obtain the pre-shift output:

10100100111011100000000000000000.

Next, the pre-shift output is right bit-shifted by a value corresponding to the logical bit-wise inversion of the shift control signal SH as expressed in binary. This is due to the shift control signal SH as described above designating the shifting of the radix point rather than the shifting of the bits of the pre-shift output. That is, SH=26=$11010_2$ which when inverted becomes $00101_2$. As such, the pre-shift output is right-shifted by five bit positions and the five most-significant bit positions are filled with '1' values due to the negative sign, yielding:

11111101001001111011100000000000.

This corresponds to a decimal value of −86489088. As there is no overflow or underflow, this value is output as the signed integer representation.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

We claim:

1. An apparatus for conversion of a floating point representation to a signed integer representation, the floating point representation including a sign, an exponent, and a mantissa, the apparatus comprising:

shift conditioning circuitry configured to generate a shift control signal based at least in part on the exponent;

two's complement circuitry configured to operate at least partially in parallel with the shift conditioning circuitry, the two's complement circuitry configured to generate a pre-shift output, the pre-shift output corresponding to a representation, in two's complement format, of the sign and the mantissa; and shift execution circuitry configured to shift the pre-shift output by a number of bit positions specified at least in part by the shift control signal;

wherein the shift execution circuitry outputs the signed integer representation under a predefined condition;

wherein the exponent is expressed using E bits, and wherein the shift conditioning circuitry is further configured to generate the shift control signal based on a scaling factor input and an exponent bias value, the exponent bias value equal to $2^{E-1}-1$, the shift conditioning circuitry comprising:

an inverter configured to operate on a most significant bit of the exponent to provide a modified exponent value, the modified exponent value corresponding to the exponent having the most significant bit thereof inverted; and an adder configured to receive the scaling factor input and the modified exponent value as summand inputs and to provide the shift control signal as output, the adder configured to receive an external carry input of logical '1'.

2. The apparatus of claim 1, further comprising an overflow/underflow correction circuitry, wherein upon detection of an overflow condition or an underflow condition, the overflow/underflow correction circuitry is configured to receive the shift control signal and an output of the shift execution circuitry and the overflow/underflow correction circuitry configured to provide the signed integer representation as a predetermined saturated value.

3. The apparatus of claim 1, wherein a number of bits in the mantissa is denoted by M, wherein the two's complement circuitry comprises:

first level circuitry comprising:

a first zero-stage circuit configured to receive a sign bit and a least significant bit A(0) of the mantissa, the first zero-stage circuit configured to generate a zero-stage least-significant-bit propagate output $P_0(0)$ and a zero-stage least-significant-bit generate output $G_0(0)$ according to:

$P_0(0)=A(0);$ $G_0(0)=\text{inv}(A(0))\text{AND sign},$ wherein inv( ) corresponds to a logical inversion operation, AND corresponds to a logical AND operation, and sign corresponds to a logical value of the sign; and for whole number values of i indexed from 1 to M−1, inclusive, a further zero-stage circuit configured to receive the sign bit and a bit A(i) of the mantissa other than A(0), the further zero-stage circuit configured to generate a zero-stage propagate output $P_0(i)$ according to:

$P_0(i)=A(i)\text{XOR sign},$ wherein XOR corresponds to a logical XOR operation;

second level circuitry comprising a number of stages indexed by r, wherein r assumes whole number values between 1 and $\log_2(M)$ inclusive, wherein each $r^{th}$ stage of the number of stages comprises a number of components indexed by i, wherein i assumes whole number values between 0 and M−1 inclusive, and wherein each of the number of components is configured to generate an $i^{th}$ component of an $r^{th}$ stage generate output $G_r(i)$ and an $i^{th}$ component of an $r^{th}$ stage propagate output $P_r(i)$ according to:

for i ranging from 0 to $2^{r-1}-1$, inclusive:

$P_r(i)=P_{r-1}(i),$ $G_r(i)=G_{r-1}(i);$ and for i ranging from $2^{r-1}$ to M−1, inclusive:

$P_r(i)=P_{r-1}(i)\text{AND }P_{r-1}(i-2^{r-1}),$ $G_r(i)=P_{r-1}(i)\text{AND }G_{r-1}(i-2^{r-1});$ and third level circuitry configured to generate a least significant bit OUT(0) of the pre-shift output, the least significant bit equal to the least significant bit A(0) of the input integer, the third level further configured to generate a number of further bits OUT(i), for i assuming whole number values between 1 and M−1, inclusive, of the pre-shift output according to:

$\text{OUT}(i)=G_{MAX\_ROW}(i-1)\text{XOR }P_0(i),$ wherein MAX_ROW equals $\log_2(M)$.

4. An apparatus for generating a representation, in two's complement format, of an input integer A having K bits, the apparatus comprising:

first level circuitry comprising:
a first zero-stage circuit configured to receive a sign bit and a least significant bit A(0) of the input integer, the first zero-stage circuit configured to generate a zero-stage least-significant-bit propagate output $P_0(\mathbf{0})$ and a zero-stage least-significant-bit generate output $G_0(\mathbf{0})$ according to:

$P_0(0)=A(0);$ $G_0(0)=\text{inv}(A(0))\text{AND sign},$ wherein inv( ) corresponds to a logical inversion operation, AND corresponds to a logical AND operation, and sign corresponds to a logical value of the sign bit; and for whole number values of i indexed from 1 to K−1, inclusive, a further zero-stage circuit configured to receive the sign bit and a bit A(i) of the input integer other than A(0), the further zero-stage circuit configured to generate a zero-stage propagate output $P_0(i)$ according to:

$P_0(i)=A(i)\text{XOR sign},$ wherein XOR corresponds to a logical XOR operation;

second level circuitry comprising a number of stages indexed by r, wherein r assumes whole number values between 1 and $\log_2(K)$ inclusive, wherein each $r^{th}$ stage of the number of stages comprises a number of components indexed by i, wherein i assumes whole number values between 0 and K−1 inclusive, and wherein each of the number of components is configured to generate an $i^{th}$ component of an $r^{th}$ stage generate output $G_r(i)$ and an $i^{th}$ component of an $r^{th}$ stage propagate output $P_r(i)$ according to:

for i ranging from 0 to $2^{r-1}-1$, inclusive:

$P_r(i)=P_{r-1}(i)$ $G_r(i)=G_{r-1}(i);$ and for i ranging from $2^{r-1}$ to K−1, inclusive:

$P_r(i)=P_{r-1}(i)\text{AND }P_{r-1}(i-2^{r-1})$ $G_r(i)=P_{r-1}(i)\text{AND }G_{r-1}(i-2^{r-1});$ and third level circuitry configured to generate a least significant bit OUT(0) of the representation, the least significant bit equal to the least significant bit A(0) of the input integer, the third level further configured to generate a number of further bits OUT(i), for i assuming whole number values between 1 and K−1, inclusive, of the representation according to:

$\text{OUT}(i)=G_{MAX\_ROW}(i-1)\text{XOR }P_0(i),$ wherein MAX_ROW equals $\log_2(K)$.

5. The apparatus of claim 4, wherein the apparatus is integrated into a device for facilitating conversion of an unsigned mantissa of a floating point representation to a representation of the unsigned mantissa in two's complement format.

6. The apparatus of claim 4, wherein the input integer is an unsigned integer, and wherein the apparatus is configured to facilitate conversion of the unsigned integer to a signed integer.

7. The apparatus of claim 4, wherein the input integer is a signed integer, and wherein the apparatus is configured to facilitate conversion of the signed integer to an unsigned integer.

8. The apparatus of claim 4, wherein the input integer is a signed integer, and wherein the apparatus is configured to facilitate computation of an absolute value of the signed integer.

9. A method for conversion of a floating point representation to a signed integer representation, the floating point representation including a sign, an exponent, and a mantissa, the method comprising:

a shift conditioning operation, performed by shift conditioning circuitry, the shift conditioning operation including generating a shift control signal based at least in part on the exponent;

a two's complement operation, performed by two's complement circuitry, the two's complement operation operating at least partially concurrently with the shift conditioning operation, the two's complement operation including generating a pre-shift output, the pre-shift output corresponding to a representation, in two's complement format, of the sign and the mantissa; and a shift execution operation, performed by shift execution circuitry, the shift execution operation including shifting of the pre-shift output by a number of bit positions specified at least in part by the shift control signal;

wherein the shift execution operation generates the signed integer representation under a predefined condition;
wherein the exponent is expressed using E bits, and wherein the shift conditioning operation generates the shift control signal based on a scaling factor input and an exponent bias value, the exponent bias value equal to $2^{E-1}-1$, the shift conditioning operation comprising:
inverting a most significant bit of the exponent to provide a modified exponent value, the modified exponent value corresponding to the exponent having the most significant bit thereof inverted; and
receiving the scaling factor input and the modified exponent value as summands along with a carry input of logical '1' and providing the shift control signal as output corresponding to a sum of the scaling factor input, the modified exponent value, and the carry input.

10. The method of claim 9, further comprising an overflow/underflow correction operation, wherein upon detection of an overflow condition or an underflow condition, the overflow/underflow correction operation receives the shift control signal and an output of the shift execution operation and the overflow/underflow correction operation provides the signed integer representation as a predetermined saturated value.

11. The method of claim 9, wherein a number of bits in the mantissa is denoted M, wherein the two's complement operation comprises:
first level operations, performed by first level circuitry, the first level operations comprising:
a first zero-stage operation performed on a sign bit and a least significant bit A(0) of the mantissa, the first zero-stage operation including generating a zero-stage least-significant-bit propagate output $P_0(0)$ and a zero-stage least-significant-bit generate output $G_0(0)$ according to:

$P_0(0)=A(0)$;

$G_0(0)=\text{inv}(A(0))\text{AND sign}$, wherein inv( ) corresponds to a logical inversion operation, AND corresponds to a logical AND operation, and sign corresponds to a logical value of the sign; and
for whole number values of i indexed from 1 to M−1, inclusive, a further zero-stage operation performed on the sign bit and a bit A(i) of the mantissa other than A(0), the further zero-stage operation including generating a zero-stage propagate output $P_0(i)$ according to:

$P_0(i)=A(i)\text{XOR sign}$, wherein XOR corresponds to a logical XOR operation;
second level operations, performed by second level circuitry, the second level operations comprising a number of stages indexed by r, wherein r assumes whole number values between 1 and $\log_2(M)$ inclusive, wherein each $r^{th}$ stage of the number of stages comprises a number of component operations indexed by i, wherein i assumes whole number values between 0 and M−1 inclusive, and wherein each of the number of component operations includes generating an $i^{th}$ component of an $r^{th}$ stage generate output $G_r(i)$ and an $i^{th}$ component of an $r^{th}$ stage propagate output $P_r(i)$ according to:
for i ranging from 0 to $2^{r-1}-1$, inclusive:

$P_r(i)=P_{r-1}(i)$, $G_r(i)=G_{r-1}(i)$; and for i ranging from $2^{r-1}$ to M−1, inclusive:

$P_r(i)=P_{r-1}(i)\text{AND }P_{r-1}(i-2^{r-1})$, $G_r(i)=P_{r-1}(i)\text{AND }G_{r-1}(i-2^{r-1})$; and third level operations, performed by third level circuitry, the third level operations comprising generating a least significant bit OUT(0) of the pre-shift output, the least significant bit equal to the least significant bit A(0) of the input integer, the third level further including generating a number of further bits OUT(i), for i assuming whole number values between 1 and M−1, inclusive, of the pre-shift output according to:

$\text{OUT}(i)=G_{MAX\_ROW}(i-1)\text{XOR }P_0(i)$, wherein MAX_ROW equals $\log_2(M)$.

12. A method for generating a representation, in two's complement format, of an input integer A having K bits, the method comprising:
first level operations, performed by first level circuitry, the first level operations comprising:
a first zero-stage operation performed on a sign bit and a least significant bit A(0) of the input integer, the first zero-stage operation including generating a zero-stage least-significant-bit propagate output $P_0(0)$ and a zero-stage least-significant-bit generate output $G_0(0)$ according to:

$P_0(0)=A(0)$;

$G_0(0)=\text{inv}(A(0))\text{AND sign}$, wherein inv( ) corresponds to a logical inversion operation, AND corresponds to a logical AND operation, and sign corresponds to a logical value of the sign bit; and
for whole number values of i indexed from 1 to K−1, inclusive, a further zero-stage operation performed on the sign bit and a bit A(i) of the input integer other than A(0), the further zero-stage operation including generating a zero-stage propagate output $P_0(i)$ according to:

$P_0(i)=A(i)\text{XOR sign}$, wherein XOR corresponds to a logical XOR operation;
second level operations, performed by second level circuitry, the second level operations comprising a number of stages indexed by r, wherein r assumes whole number values between 1 and $\log_2(K)$ inclusive, wherein each $r^{th}$ stage of the number of stages comprises a number of component operations indexed by i, wherein i assumes whole number values between 0 and K−1 inclusive, and wherein each of the number of component operations includes generating an $i^{th}$ component of an $r^{th}$ stage generate output $G_r(i)$ and an $i^{th}$ component of an $r^{th}$ stage propagate output $P_r(i)$ according to:
for i ranging from 0 to $2^{r-1}-1$, inclusive:

$P_r(i)=P_{r-1}(i)$ $G_r(i)=G_{r-1}(i)$; and for i ranging from $2^{r-1}$ to K−1, inclusive:

$P_r(i)=P_{r-1}(i)\text{AND }P_{r-1}(i-2^{r-1})$, $G_r(i)=P_{r-1}(i)\text{AND }G_{r-1}(i-2^{r-1})$; and third level operations, performed by third level circuitry, the third level operations comprising generating a least significant bit OUT(0) of the representation, the least significant bit equal to the least significant bit A(0) of the input integer, the third level further including generating a number of further bits OUT(i), for i assuming whole number values between 1 and K−1, inclusive, of the representation according to:

OUT($i$)=$G_{MAX\_ROW}$($i$−1)XOR $P_0$($i$), wherein MAX_ROW equals $\log_2(K)$.

13. The method of claim 12, wherein the method forms part of a further method for facilitating conversion of an unsigned mantissa of a floating point representation to a representation of the unsigned mantissa in two's complement format.

14. The method of claim 12, wherein the input integer is an unsigned integer, and wherein the method is applied for facilitating conversion of the unsigned integer to a signed integer.

15. The method of claim 12, wherein the input integer is a signed integer, and wherein the method is applied for facilitating one of the following:

conversion of the signed integer to an unsigned integer; and computation of an absolute value of the signed integer.

\* \* \* \* \*

UNITED STATES PATENT AND TRADEMARK OFFICE
CERTIFICATE OF CORRECTION

PATENT NO. : 9,722,629 B2  
APPLICATION NO. : 14/597917  
DATED : August 1, 2017  
INVENTOR(S) : Huong Ho and Michel Kafrouni Page 1 of 1

It is certified that error appears in the above-identified patent and that said Letters Patent is hereby corrected as shown below:

In the Specification

Column 9, Line 44, "TNT" should read --INT--.

Column 13, Line 30, "$P_0(i)A(i)$ XOR sign" should read --$P_0(i)=A(i)$ XOR sign--.

Column 13, Line 59, "venerate" should read --generate--.

Signed and Sealed this  
Twenty-fourth Day of October, 2017

Joseph Matal  
*Performing the Functions and Duties of the*  
*Under Secretary of Commerce for Intellectual Property and*  
*Director of the United States Patent and Trademark Office*